United States Patent
Tanaka

(10) Patent No.: US 7,521,326 B2
(45) Date of Patent: Apr. 21, 2009

(54) SEMICONDUCTOR DEVICE AND MANUFACTURING METHOD THEREOF

(75) Inventor: Koichiro Tanaka, Isehara (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 271 days.

(21) Appl. No.: 11/285,142

(22) Filed: Nov. 23, 2005

(65) Prior Publication Data
US 2006/0121680 A1 Jun. 8, 2006

(30) Foreign Application Priority Data
Dec. 3, 2004 (JP) .............................. 2004-352073

(51) Int. Cl.
*H01L 21/336* (2006.01)
(52) U.S. Cl. .................. 438/301; 438/308; 438/530; 438/540; 257/E21.135; 257/E21.347; 257/E21.634
(58) Field of Classification Search ............... 438/301, 438/537, 308, 530, 540; 257/E21.143, E21.347, 257/E21.634, E21.135
See application file for complete search history.

(56) References Cited

U.S. PATENT DOCUMENTS

| | | | |
|---|---|---|---|
| 6,380,044 B1 * | 4/2002 | Talwar et al. ............... | 438/308 |
| 6,642,122 B1 * | 11/2003 | Yu ............................ | 438/372 |
| 6,703,281 B1 * | 3/2004 | Yu ............................ | 438/303 |
| 6,743,687 B1 * | 6/2004 | Yu ............................ | 438/303 |
| 6,743,689 B1 * | 6/2004 | Paton et al. ................. | 438/305 |
| 2002/0086502 A1 * | 7/2002 | Liu et al. .................... | 438/530 |
| 2002/0121654 A1 * | 9/2002 | Yamamoto .................. | 257/288 |
| 2002/0175372 A1 | 11/2002 | Takizawa | |
| 2004/0132249 A1 * | 7/2004 | Mitsuda et al. ............. | 438/260 |
| 2006/0088984 A1 * | 4/2006 | Li et al. ...................... | 438/463 |
| 2007/0178672 A1 * | 8/2007 | Tanaka et al. ............... | 438/487 |

FOREIGN PATENT DOCUMENTS

| | | |
|---|---|---|
| JP | 2002-151431 | 5/2002 |
| JP | 2002-246329 | 8/2002 |
| JP | 2002-246601 | 8/2002 |
| JP | 2004-214607 | 7/2004 |

\* cited by examiner

*Primary Examiner*—Charles D. Garber
*Assistant Examiner*—Stanetta D Isaac
(74) *Attorney, Agent, or Firm*—Eric J. Robinson; Robinson Intellectual Property Law Office, P.C.

(57) ABSTRACT

It is an object of the present invention to provide a semiconductor device superior in the decrease in leak current due to a short-channel effect and a manufacturing method thereof. In a process of forming a field-effect transistor over a single-crystal semiconductor substrate, an impurity is introduced to form an extension region and a single crystal lattice is broken to make the extension region amorphous. Alternatively, the impurity and an element having large mass number are introduced to break the single crystal lattice and make the extension region amorphous. Then, a laser beam with a pulse width of 1 fs to 10 ps and a wavelength of 370 to 640 nm is delivered to selectively activate the amorphous portion, so that the extension region is formed with a thickness of 20 nm or less.

36 Claims, 13 Drawing Sheets absorption coefficient of a-Si and poly-Si
(measured by spectroscopic ellipsometry)

absorption coefficient of a-Si and poly-Si
(measured by spectroscopic ellipsometry)

SEMICONDUCTOR DEVICE AND MANUFACTURING METHOD THEREOF

BACKGROUND OF THE INVENTION

1. Field of the Invention

The present invention relates to a method for manufacturing a semiconductor device using a laser irradiation apparatus for irradiating an object with a laser beam. Specifically, the present invention relates to a semiconductor device including a thin film transistor (hereinafter referred to as a TFT) having ultrashallow junction. For example, the present invention relates to a large scale integrated circuit (LSI), an electro-optic device typified by a liquid crystal display panel, a light-emitting display device having a light-emitting element, a light-receiving device having a CCD (charge-coupled device), a memory device such as an SRAM or a DRAM, and an electronic appliance equipped with any one of these devices as its component.

In this specification, the semiconductor device indicates general devices which can function by using a semiconductor characteristic. An electro-optic device, a semiconductor circuit, and an electronic appliance having these are all included in the semiconductor device.

2. Related Art

Research and development have been widely conducted on size reduction and high integration of semiconductor elements. In particular, a technique for reducing the size of an insulating gate electric-field effect semiconductor element called a MOSFET (MOS Field Effect Transistor) has been remarkably advanced. MOS stands for Metal-Oxide-Semiconductor, which is a structure in which three kinds of materials (substances) of metal, oxide, and semiconductor are combined.

Here, the metal includes not only pure metal but also a semiconductor material having sufficiently high conductance, an alloy of semiconductor and metal, and the like. The oxide includes not only pure oxide but also an insulating material having sufficiently high resistance, such as nitride. Even in such cases, the term MOS is applied in general. Hereinafter in this specification, an electric-field effect element having such a structure including nitride and other insulating materials is referred to as a MOSFET.

Either an N-channel or P-channel MOSFET generally includes a channel formation region, a gate insulating film, a gate electrode, a source region, and a drain region. Since this MOSFET can be highly-integrated easily, the MOSFET is widely used as a transistor element having an integrated circuit.

A MOSFET is reduced in size by narrowing the width of its gate electrode. With the size reduction of a MOSFET, an LDD (Lightly Doped Drain) structure in which a drain region on a channel formation region side is lightly doped as shown in FIG. 2F is used to prevent a short-channel effect or hot electron generation.

By employing the LDD structure, the amount of impurities diffusing into the drain region on the channel formation region side can be decreased and the length of a channel length can be secured. Moreover, since the gradient of impurity concentration distribution in a pn junction portion formed at a boundary between a channel formation region and an impurity region (drain region) can be relaxed, electric-field concentration can be relaxed in this region, which allows stabilization of operation of an element.

A MOSFET having an LDD structure is formed as shown in FIGS. 2A to 2F in general. Although an example of manufacturing an N-type MOSFET is shown here, a P-type MOSFET can also be manufactured similarly.

First, an oxide film 201 and a conductive film 202 are formed over a main plane of a P-type semiconductor substrate 200 as shown in FIG. 2A. By etching these films, a gate insulating film 203 and a gate electrode 204 are formed respectively as shown in FIG. 2B. Then, an impurity is introduced into the main plane of the semiconductor substrate by an ion implantation method or the like by using the gate electrode 204 as a mask, thereby forming a low-concentration impurity region 205 in a self-aligning manner (this impurity region is hereinafter referred to as an extension region) (FIG. 2C). In this case, the extension region 205 is shown with an n⁻ mark.

Next, as shown in FIG. 2D, an insulating film 206 is formed over the extension region 205. Then, anisotropic etching such as bias plasma etching is conducted to the insulating film 206, thereby forming a sidewall spacer 207 (FIG. 2E). Next, a high-concentration impurity region (shown with an n⁺ mark) is formed in a self-aligning manner by using the sidewall spacer 207 as a mask. After that, the added impurity is activated by heating the respective impurity regions so that a source region 208 and a drain region 209 are formed (FIG. 2F).

Further size reduction is required also in a MOSFET. The problem is, however, the decrease in drain current. In order to solve this, it is effective to make an extension region low resistant. In order to lower the resistance of the extension region, ions of impurities need to be implanted at high concentration into an ultrashallow region of a main plane of a semiconductor substrate and the implanted impurities need to be activated.

Conventionally, an RTA (Rapid Thermal Annealing) method has been employed as a heat treatment for activating an impurity. However, this RTA has the following problem.

In an RTA method, heat time is as long as several seconds during which an impurity inside an extension region diffuses deep. When the impurity diffuses deep, junction becomes deep, resulting in that an area where a gate electrode overlaps a source region and a drain region becomes larger. Therefore, the effective channel length becomes shorter, which causes electric-field concentration and a short-channel effect. Consequently, a novel annealing method which can carry out a heat treatment in a shorter time than the heat treatment by RTA is required.

SUMMARY OF THE INVENTION

Thus, it is an object of the present invention to provide an annealing method which can locally give high-temperature heat in a short time and to provide a semiconductor device manufactured by this annealing method.

Specifically, a portion which will become an extension region is doped with an N-type or P-type impurity to break a single-crystal lattice, so that the portion is made amorphous. Then, a semiconductor substrate including the extension region which has become amorphous is irradiated with a laser beam having a pulse width of 1 fs to 10 ps and a wavelength of 370 to 640 nm, so that the extension region is activated.

Specifically, after introducing an N-type or P-type impurity into the portion which will be the extension region, the single-crystal lattice is broken by implanting an element having large mass number such as Ge or a zeroth element (Ar, Kr, Xe, Rn, or the like), so that the portion is made amorphous. Then, the semiconductor substrate including the extension region which has become amorphous is irradiated with a laser beam having a pulse width of 1 fs to 10 ps and a wavelength of 370 to 640 nm, so that the extension region is activated.

In the above structure, a laser having a wavelength range of 370 to 640 nm is selected because this wavelength range is absorbed more in an amorphous semiconductor than in a single-crystal semiconductor. FIG. 3 is a graph showing the relation between a wavelength and an absorption coefficient in an amorphous silicon film and a single-crystal silicon film. According to this graph, a difference of an absorption coefficient is seen between amorphous silicon and poly-crystal silicon in the range of 370 to 640 nm, particularly 400 to 540 nm. In other words, when a laser beam having this wavelength range is delivered, the extension region easily absorbs the laser beam but the single-crystal silicon film does not easily absorb the laser beam. According to the present invention, by annealing with the laser beam having this wavelength range, the energy by the laser beam is selectively given only to the extension region.

Since an ultrashort pulse laser having a pulse width of 1 fs to 10 ps is used in the present invention, the time for which heat is given to the extension region can be largely shortened. Therefore, as compared with an RTA method, the diffusion of the impurity can be suppressed drastically. As a result, such advantages can be obtained that electric-field concentration is relaxed and a short-channel effect is suppressed.

Moreover, in the present invention, a laser having a repetition rate of 10 MHz or more is used in the irradiation so as to shorten a process time, whereby a semiconductor device can be manufactured with high throughput.

In the above structure, the extension region may be formed in such a way that the portion to become the extension region is made amorphous by implanting the above element having large mass number to break a single-crystal lattice and then an atom imparting N-type or P-type conductivity is introduced. Contrary, the element having large mass number may be implanted after introducing the atom imparting N-type or P-type conductivity. Furthermore, the element having large mass number may be implanted together with the atom imparting N-type or P-type conductivity. Here, the impurity element imparting N-type conductivity is, for example, phosphorus, arsenic, or antimony. Meanwhile, the impurity element imparting P-type conductivity is, for example, boron or aluminum.

In the above structure, the extension region can be formed favorably because a channeling phenomenon and a shadow effect can be prevented by introducing the impurity and the element having large mass number into the semiconductor substrate in such a way that the semiconductor substrate is rotated continuously or that the impurity and the element having large mass number is introduced obliquely relative to the semiconductor substrate. The channeling phenomenon is a phenomenon in which the introduced impurity passes through a space between crystals to penetrate deep in the substrate, and the shadow effect is a phenomenon in which a region where the impurity and the element having large mass number are not introduced is likely to be formed because the surface has an uneven portion.

By using the above structure, the depth of the extension region can be made 0.1 to 20 nm.

In the above structure, the semiconductor substrate indicates the followings: (1) a single-crystal silicon substrate or a compound semiconductor substrate, which is typified by an N-type or P-type single-crystal silicon substrate, a GaAs substrate, an InP substrate, a GaN substrate, a SiC substrate, a sapphire substrate, or a ZnSe substrate, and (2) an SOI (Silicon On Insulator) substrate, which is typified by a substrate manufactured by a pasting method or a SIMOX (Separation by IMplanted OXygen) method. In addition, a substrate made of an insulating material such as glass, quartz, or synthetic resin over which a single-crystal semiconductor film is formed can also be used.

As a semiconductor element in which an integrated circuit is formed with a semiconductor substrate, a CPU, a memory, and an IC are typically given.

With the above structure, a semiconductor device in which leak current between a source region and a drain region due to a short-channel effect is decreased can be manufactured.

According to the present invention, since high-temperature heat can be given locally in a short time, the extension region can be formed shallowly. When the extension region can be formed shallowly, such advantages can be obtained that a short-channel effect can be suppressed, electric-field concentration can be relaxed, and so on.

BRIEF DESCRIPTION OF THE DRAWINGS

In the accompanying drawings.

DETAILED DESCRIPTION OF THE INVENTION

Embodiment Mode and Embodiments are hereinafter described with reference to the drawings. However, since the present invention can be carried out with many different modes, it is to be understood by those skilled in the art that the modes and the details can be changed variously without departing from the scope and the spirit of the present invention. Therefore, the present invention is not limited by the description of Embodiment Mode and Embodiments.

EMBODIMENT MODE

An example of the present invention is described with reference to FIGS. 1A to 1E.

Figure 1A:
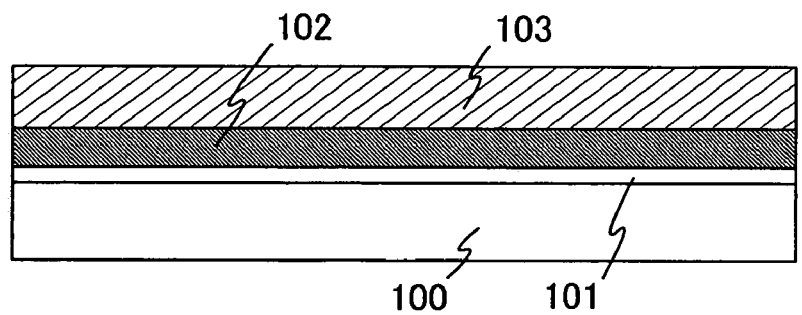
FIGS. 1A to 1E show Embodiment Mode of the present invention.

First, as shown in FIG. 1A, a gate insulating film 101, a semiconductor film 102, and a film 103 are formed over a single-crystal semiconductor substrate 100.

In this embodiment mode, the gate insulating film 101 is formed by thermally oxidizing the single-crystal semiconductor substrate 100. The gate insulating film 101 may be formed by a CVD method instead of the thermal oxidation method. As a material of the gate insulating film 101, a silicon oxynitride film, a silicon nitride film, a multilayer film of these, a high dielectric constant material such as tantalum oxide, or the like can be used. Moreover, a formation method of the gate insulating film 101 is not limited to one. For example, the gate insulating film 101 may be formed with a multilayer film including a silicon oxide film with a thickness of 5 nm obtained by a thermal oxidation method and a silicon oxynitride film with a thickness of 10 to 15 nm obtained by a CVD method.

Next, the semiconductor film 102 and the film 103 are formed all over the surface. Since the film 103 needs to serve as a mask at ion implantation to protect a gate electrode, sufficient thickness is required. Therefore, the film 103 can be formed with a sufficiently thick silicon nitride film, multilayer film of a silicon nitride film and a silicon oxide film, multilayer film in which a carbon film, an organic material film such as photoresist, or the like is stacked over a thin silicon nitride film, or the like. In this embodiment mode, the film 103 is formed with a silicon nitride film.

Figure 1B:
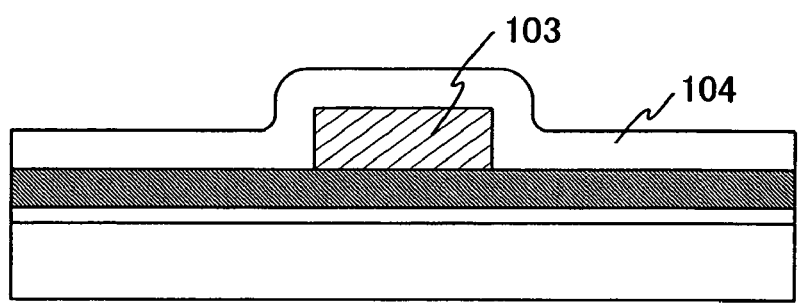

Next, as shown in FIG. 1B, the silicon nitride film 103 is shaped into a desired form based on a lithography technique and a dry etching technique. Moreover, a silicon oxide film 104 is uniformly formed by a normal pressure CVD method, a low pressure CVD method, a plasma CVD method, a photo CVD method, or the like. At this time, when the silicon nitride film 103 contains an organic material, the organic material may change in quality or the organic material may evaporate if the film is formed at high temperature. Consequently, it is necessary to consider the contained material when the silicon nitride film 103 is formed.

Figure 1C:
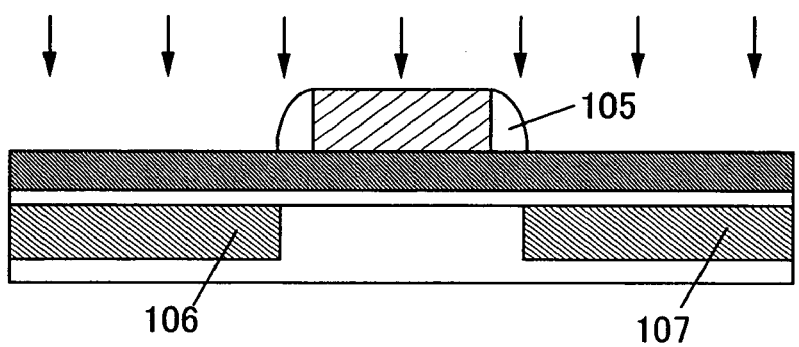

After that, a sidewall 105 is formed with silicon oxide by a known anisotropic etching technique as shown in FIG. 1C. Then, an impurity is introduced by an ion implantation method or the like in such a state, so that a source region 106 and a drain region 107 are formed. Since an N-type FET is manufactured in this embodiment mode, an N-type impurity such as arsenic (As), phosphorus (P), or antimony (Sb) is introduced. In the case of manufacturing a P-type FET, a P-type impurity such as boron (B) is introduced.

Moreover, the sidewall 105 is selectively removed and the impurity introduced into the source region 106 and the drain region 107 is activated by a laser annealing method, an RTA method, or the like. At the same time, the crystallinity of the source region 106 and the drain region 107 broken by the impurity introduction is improved.

Figure 1D:
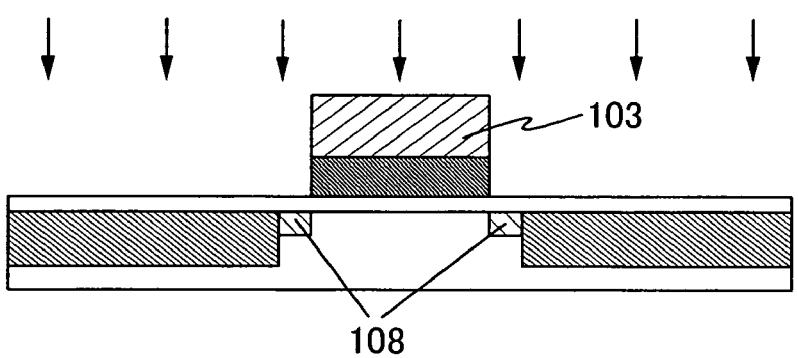

Next, as shown in FIG. 1D, an extension region 108 is formed by introducing an impurity very shallowly by a plasma doping method, an ion implantation method, or the like. Since an N-type FET is formed in this embodiment mode, an N-type impurity such as arsenic (As), phosphorus (P), or antimony (Sb) is introduced. In the case of manufacturing a P-type FET, boron (B), which is a P-type impurity, is introduced. Here, the concentration of the impurity implanted in the extension region 108 may be lower than, the same as, or higher than that in the source region 106 and the drain region 107. In other words, the impurity concentration of the extension region 108 may be determined based on a characteristic required in a semiconductor device.

Moreover, an element having large mass number such as germanium (Ge) or a zeroth element (Ar, Kr, Xe, Rn, or the like) is implanted to break a single-crystal lattice in the extension region 108. At this time, the implantation speed is decreased to make the extension region amorphous approximately 20 nm in depth. The order of the impurity introduction and the implantation of the element having large mass number is not limited. Either one may be conducted first or they may be conducted at the same time.

In the single-crystal semiconductor substrate 100, atoms are arranged in order. In particular, in a <100> plane or a <111> plane of silicon, a phenomenon in which the introduced impurity passes through a space between crystals to penetrate deep in the substrate occurs (channeling phenomenon). Consequently, the impurity is implanted so that a direction in which the impurity is introduced is tilted to a crystal orientation of the single-crystal semiconductor substrate 100, which makes it possible to reduce the space between the atoms. Therefore, the introduced impurity stops at the vicinity of the surface of the crystal and is prevented from penetrating deep in the substrate.

Further, since an uneven portion due to the silicon nitride film 103 or the like exists around the portion which will become the extension region 108, a region where the impurity and the element having large mass number are not introduced is likely to be formed (referred to as a shadow effect). In order to prevent the shadow effect, the impurity may be implanted while rotating the single-crystal semiconductor substrate 100 continuously or the impurity introduction and the rotation of the substrate may be conducted alternately. It is more preferable to introduce the impurity and the element having large mass number while rotating the single-crystal semiconductor substrate 100, because the channeling phenomenon and the shadow effect can be prevented at the same time.

Figure 1E:
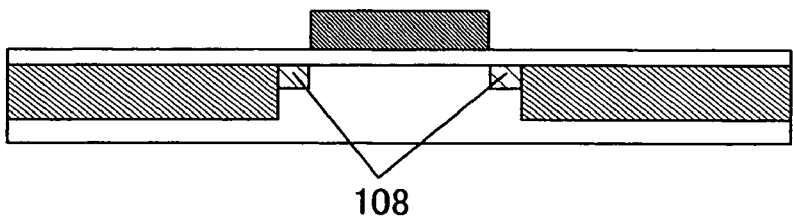
Figure 2A:
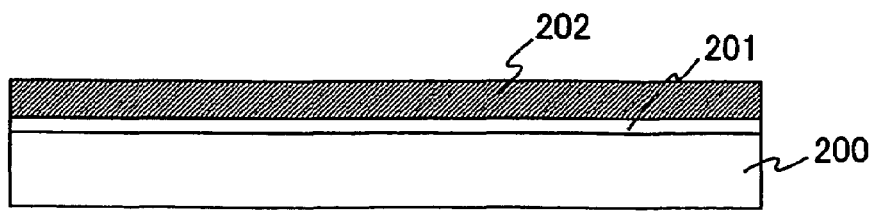
FIGS. 2A to 2F show a conventional example.
Figure 2B:
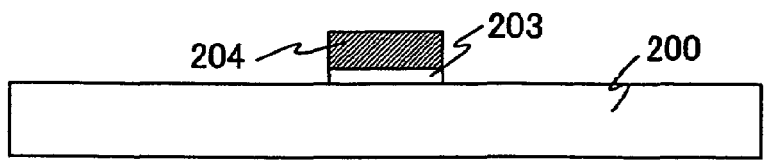
Figure 2C:
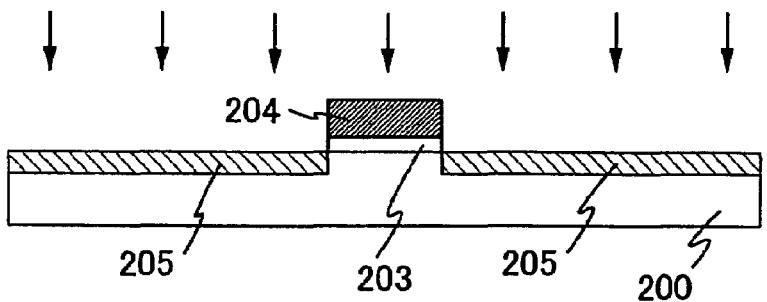
Figure 2D:
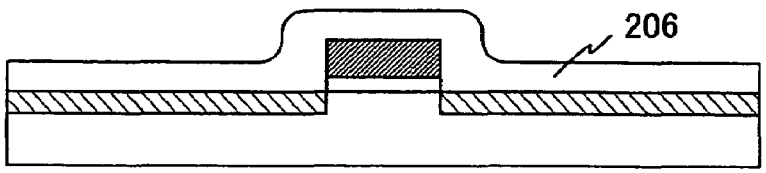
Figure 2E:
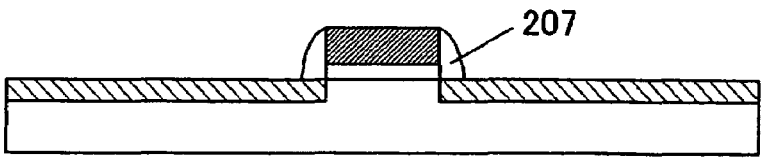
Figure 2F:
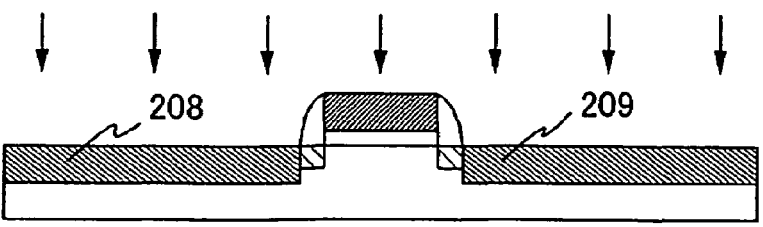

After introducing the impurity and the element having large mass number, laser annealing according to the present invention is conducted to activate the introduced impurity element while keeping an ultrashallow and high-concentration profile. Subsequently, the silicon nitride film 103 is selectively removed by etching (FIG. 1E).

Figure 3:
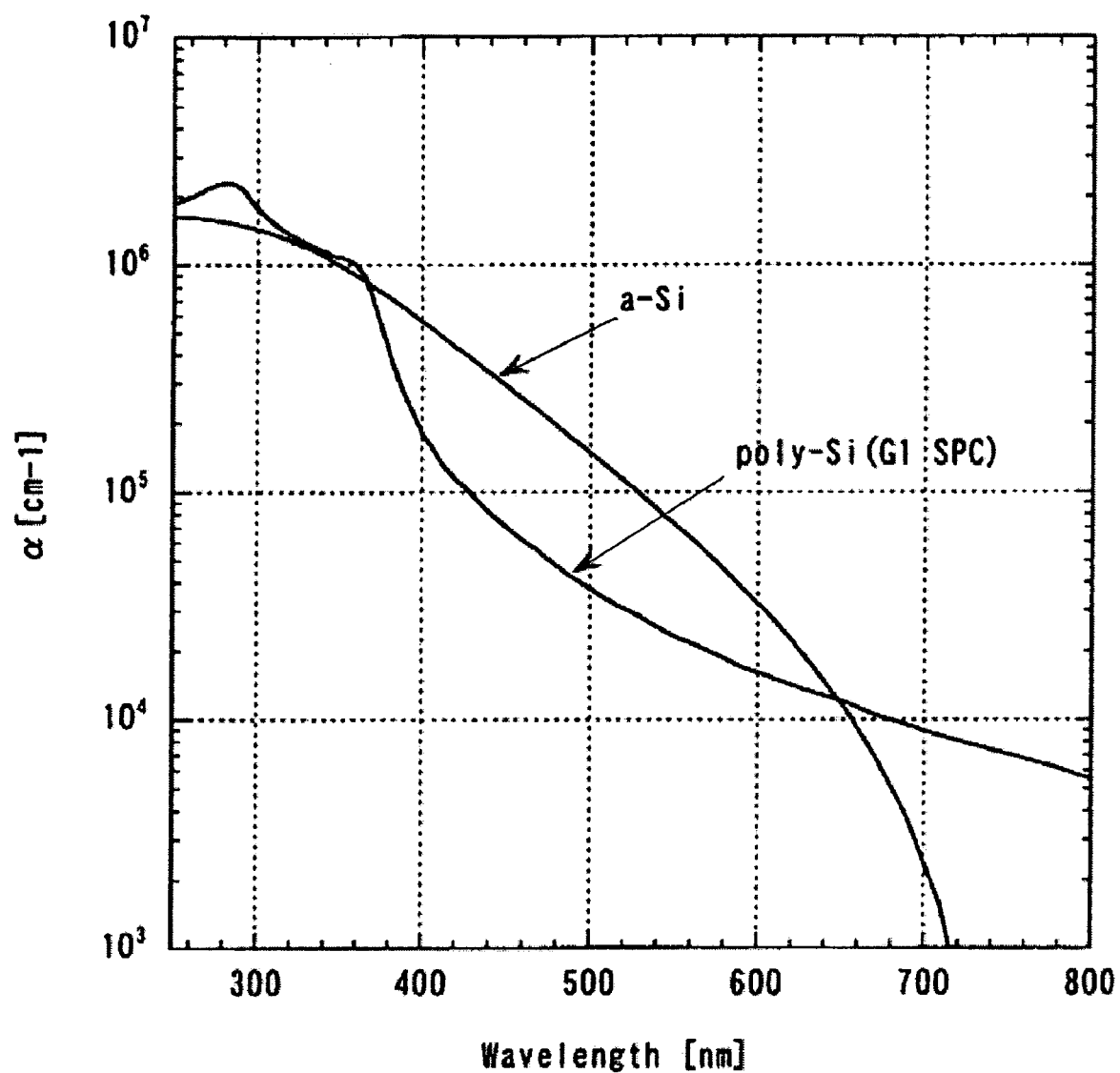
FIG. 3 is a graph showing wavelength dependency of an absorption coefficient between single-crystal silicon and amorphous silicon.

In the laser annealing according to the present invention, the pulse width is selected from the range of 1 fs to 10 ps and the wavelength is selected from the range of 370 to 640 nm because, as shown in FIG. 3, this wavelength range is absorbed more in an amorphous semiconductor than in a single-crystal semiconductor.

The laser oscillator preferably includes a stable resonator and has a spatial profile of $TEM_{00}$ (single transverse mode). In the case of $TEM_{00}$ mode, since the laser beam has Gaussian intensity distribution and has a high light-condensing property, a beam spot can be easily shaped. When the laser beam emitted from the laser oscillator has a fundamental wavelength in an infrared region, the laser beam can be converted into a second harmonic (wavelength: approximately 532 nm) by a non-linear optical element and be used. In this embodiment mode, a $YVO_4$ laser having an energy of 10 W, a spatial profile of $TEM_{00}$ mode, a second harmonic (532 nm), a repetition rate of 160 MHz, and a pulse width of 10 ps is used. A beam spot formed on an irradiation object can have a desired shape by using an optical system. The present invention is not limited to an irradiation condition shown in this embodiment mode.

The laser annealing is conducted as above to activate the added impurity element at the same time as decreasing a crystal defect formed by adding the impurity. In this embodiment mode, by selecting the wavelength of 532 nm, the energy of the laser beam is absorbed only in the extension region which has become amorphous, so that the extension region can be selectively heated. Further, since the pulse width is as short as 1 fs to 10 ps, the diffusion of the impurity can be suppressed. Moreover, the process time can be shortened because the laser having a repetition rate of 10 MHz or more is used.

Thus, the extension region 108 can be kept shallow, and a semiconductor device manufactured by using the present invention can obtain advantages that a short-channel effect is suppressed, electric-field concentration is relaxed, and so on.

Moreover, by conducting an appropriate step subsequently, a semiconductor device can be manufactured. The semiconductor device manufactured according to the present invention can have a favorable electric characteristic and a largely-improved operating characteristic.

This embodiment mode can be combined with another embodiment. Moreover, this embodiment mode can also be applied similarly to a thin film transistor which has a semiconductor film formed over an insulating substrate such as a glass substrate, a quartz substrate, or an organic resin substrate.

Embodiment 1

Embodiment 1 will describe an example of a laser irradiation apparatus used in the present invention with reference to the drawings.

Figure 4:
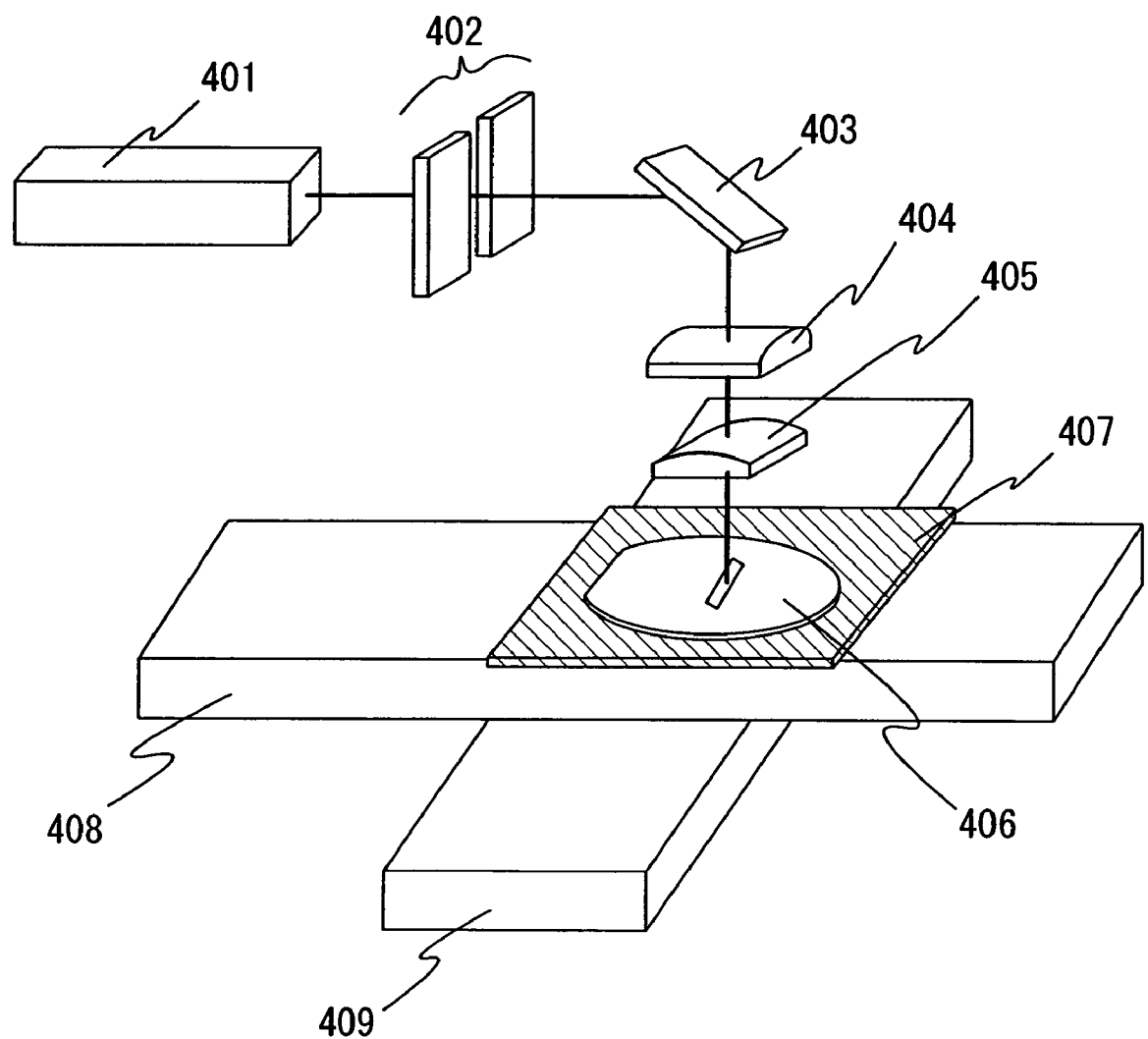
FIG. 4 shows an example of a laser irradiation apparatus used in the present invention.

A laser oscillator 401 shown in FIG. 4 is a laser oscillator having a pulse width on a femtosecond time scale (1 femtosecond=$10^{-15}$ second). This laser is also referred to as a femtosecond laser. A laser beam emitted from the laser oscillator 401 is converted into a harmonic with a wavelength of 370 to 640 nm, preferably 400 to 540 nm, by using a non-linear optical element as necessary.

As a laser used in the present invention, for example, a laser in which a crystal of sapphire, YAG, ceramic YAG, ceramic $Y_2O_3$, KGW, KYW, $Mg_2SiO_4$, YLF, $YVO_4$, $GdVO_4$, or the like is doped with Nd, Yb, Cr, Ti, Ho, Er, or the like is given. However, another laser which can satisfy the above condition of the pulse width and the wavelength can be used. Moreover, it is preferable to use a laser having a repetition rate of more than 10 MHz in addition to the above condition because the process time can be shortened.

First, the laser beam emitted from the laser oscillator 401 passes through a slit 402. The slit 402 can block a low-energy portion of the laser beam and adjust the length of the laser beam in a major-axis direction on an irradiation surface. The slit 402 is not particularly limited in the present invention, and the slit 402 can have any structure and shape which can block a low-intensity portion of the laser beam when passing through the slit.

Although the slit 402 is used in this embodiment, a beam homogenizer including a cylindrical lens, a cylindrical lens array, a fly-eye lens, a light pipe, a diffractive optics, or the like may be used instead of the slit 402. By using such a beam homogenizer to homogenize the energy density of the beam, energy can be given to the irradiation surface homogeneously. Moreover, both of the beam homogenizer and the slit can be used.

Next, a direction of the laser beam which has passed through the slit 402 is changed by a mirror 403 and deflected toward a semiconductor substrate 406. It is to be noted that the laser beam may be deflected so as to be perpendicular to the semiconductor substrate.

Subsequently, the laser beam whose direction has been changed by the mirror 403 is condensed by a first cylindrical lens 404 acting in only one direction. Moreover, the laser beam is condensed by a second cylindrical lens 405 acting in only one direction which intersects the direction where the first cylindrical lens 404 acts. Then, the laser beam is delivered to the semiconductor substrate 406. With the first cylindrical lens 404 and the second cylindrical lens 405, a linear, elliptical, or rectangular beam irradiation region is obtained on the irradiation surface.

The advantage in using the cylindrical lenses 404 and 405 is that the beam can be condensed independently in a major-axis direction and a minor-axis direction. If the beam diameter, output power, and beam shape of an original beam can be used without any change, the number of cylindrical lenses to be used is not necessarily two. Moreover, if the laser beam is condensed while keeping the ratio of the length between the major axis and the minor axis of the original beam, a spherical lens may be used instead of the cylindrical lenses 404 and 405.

Then, the semiconductor substrate 406 is moved at appropriate speed to conduct the laser irradiation. The semiconductor substrate 406 is fixed onto a substrate fixing stage 407 by a suction means or a mechanically fixing means. Further, the substrate fixing stage 407 can move in an X direction or a Y direction on a plane parallel to the surface of the semiconductor substrate using an X stage 408 and a Y stage 409. The X stage 408 and the Y stage 409 can move the semiconductor substrate fixed onto the substrate fixing stage 407 at 100 to 1000 mm/s. Here, the laser beam is delivered in such a way that the stage where the semiconductor substrate is set is moved in the X direction (or Y direction) relative to the fixed irradiation region of the laser beam. According to the experiences of the present inventors, the optimum scanning speed is approximately 400 mm/s.

Moreover, the laser beam can be moved by any one of the following methods: (1) an irradiation system moving method in which an irradiation position of a laser beam is moved while fixing a substrate as a process object; (2) a process object moving method in which the irradiation position of the laser beam is fixed while moving the substrate; and (3) a method in which the above two methods are combined. For example, a galvanometer mirror or a polygon mirror may be used to deliver the laser beam instead of moving the X stage 408 and the Y stage 409.

Further, thermal diffusion distance with respect to a pulse width of a laser can be obtained by the following formula (1).

$$L_D \approx (D_F \tau_L)^{\frac{1}{2}} \qquad (1)$$

In the formula (1), $\tau_L$ is time, which means a pulse width of the laser, $D_F$ is a thermal diffusion coefficient of a material which is obtained in the following formula (2) where $K_T$ is heat conductance, $\rho$ is density, and $C_P$ is specific heat capacity.

$$D_F = K_T/\rho C_P \qquad (2)$$

The heat conductance $K_T$ of crystal silicon is 148 W/m·K, the density $\rho$ thereof is 2330 kg/m³, and the specific heat capacity $C_P$ thereof is 700 J/kg·K. From these values, the thermal diffusion coefficient $D_F$ can be calculated to be $9.074 \times 10^{-5}$ m²/s.

By assigning these values to the formula (1), the thermal diffusion distance of silicon can be obtained. For example, when the laser has a pulse width of 1 ps, the thermal diffusion distance $L_D$ of crystal silicon is calculated to be 9.525 nm. In this way, in the case of using a laser beam having a pulse width on a femtosecond ($10^{-15}$ second) to picosecond time scale, the thermal diffusion distance of crystal silicon is extremely small and only a portion irradiated with a laser beam becomes a high-temperature and high-density energy state, so that a layer formed by a heat effect due to the heat diffusion hardly appears. In other words, when a laser beam having a pulse width on a femtosecond ($10^{-15}$ second) to picosecond time scale is used to activate the impurity added in the semiconductor, ultrashallow junction in which the junction depth is shallow can be formed.

In the present invention, the junction depth can be freely adjusted by appropriately setting the irradiation condition such as the pulse width of the laser.

Embodiment 2

Embodiment 2 will describe a procedure for manufacturing an FET which is different from Embodiment Mode.

First, similarly to FIG. 1A, a gate insulating film 501, a conductive film 502, and a film 503 are formed over a single-crystal semiconductor substrate 500.

The single-crystal semiconductor substrate 500 may be, for example, an SOI (Silicon On Insulator) substrate manufactured by a pasting method or a SIMOX (Separation by IMplanted Oxygen) method or a silicon wafer. When a semiconductor element is manufactured by using an SOI substrate, the adjacent elements can be separated completely, thereby preventing the flowing of leak current.

In this embodiment, an oxide film formed by thermally oxidizing the single-crystal semiconductor substrate 500 is used as the gate insulating film 501. The gate insulating film 501 may be formed not only by a thermal oxide method used in this embodiment but also by a plasma CVD method or a sputtering method.

The formation method of the gate insulating film 501 is not limited to one. For example, the gate insulating film 501 may be formed with a multilayer film including a silicon oxide film with a thickness of 5 nm obtained by thermal oxidation and a silicon oxynitride film with a thickness of 10 to 15 nm obtained by a CVD method. In the case of using a multilayer film of a silicon nitride oxide film and a silicon oxynitride film as the gate insulating film 501, the films can be formed continuously by switching gas using a CVD method.

A material of the gate insulating film 501 can be (1) a silicon oxide film, a silicon nitride oxide film ($SiN_xO_y$ (x and y are integer numbers of 1 or more satisfying x>y), a silicon oxynitride film ($SiN_xO_y$ (x and y are integer numbers of 1 or more satisfying x<y), a silicon nitride film, or a multilayer film of these, or (2) a high dielectric constant material (also referred to as a high-k material) such as tantalum oxide, hafnium oxide ($HfO_2$), hafnium nitride silicate (HfSiON), zirconium oxide ($ZrO_2$), or aluminum oxide ($Al_2O_3$), rare-earth oxide such as lanthanum oxide ($La_2O_2$), or the like.

The conductive film 502 is formed with an amorphous semiconductor film or a metal film over the gate insulating film 501 by a known method (such as a sputtering method, an LPCVD method, or a plasma CVD method). More specifically, the conductive film 502 can be formed with a semiconductor material such as silicon or silicon germanium, an element selected from gold (Au), silver (Ag), copper (Cu), platinum (Pt), aluminum (Al), molybdenum (Mo), tungsten (W), titanium (Ti), and tantalum (Ta), or a combined material or compound material containing the above element as its main component. Further, a multilayer film of these materials can be used. For example, a multilayer film of tungsten (W) and tantalum nitride (TaN) or a multilayer film of aluminum (Al) and molybdenum (Mo) can be used. In this embodiment, silicon is used as the material of the conductive film 502.

In the case of using a high dielectric constant material (high-k material) for the gate insulating film 501, it is desirable to use a metal element or a material containing the metal element as its main component for the conductive film 502. By using this combination, depletion of the gate electrode can be reduced and a large amount of current can be flowed so that lower power consumption of a semiconductor element can be achieved.

In this embodiment, the film 503 is formed with a silicon nitride film. Since the film 503 needs to serve as a mask at the ion implantation, sufficient thickness is necessary. Therefore, the film 503 can be formed with a sufficiently thick silicon nitride film, multilayer film including a silicon nitride film and a silicon oxide film, multilayer film formed by stacking a carbon film, an organic material film such as photoresist, or the like over a thin silicon nitride film, or the like.

Figure 5A:
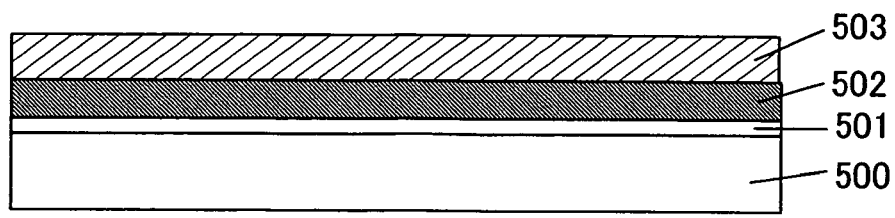
FIGS. 5A to 5F show Embodiment Mode of the present invention.
Figure 5B:
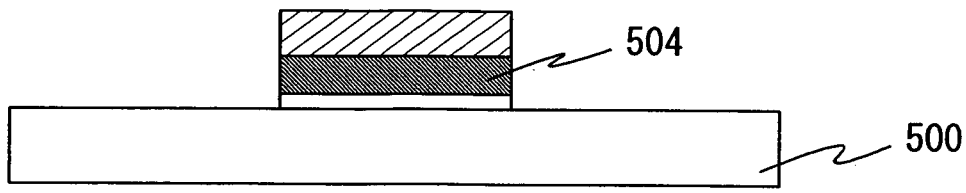

Next, as shown in FIG. 5B, a gate electrode 504 is formed by shaping the multilayer film of these in a desired form by a lithography technique and a dry etching technique. In order to make the gate electrode 504 low resistant, the gate electrode 504 may be doped with phosphorus (P) in advance at a concentration of approximately $10^{21}$ atoms/cm$^3$ or may have N-type impurities diffused at high concentration after forming the conductive film 502.

Figure 5C:
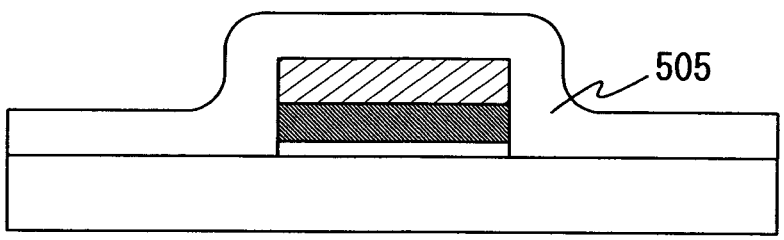

Moreover, as shown in FIG. 5C, a silicon oxide film 505 is formed uniformly by a normal pressure CVD method, a low pressure CVD method, a plasma CVD method, a photo CVD method, or the like.

Figure 5D:
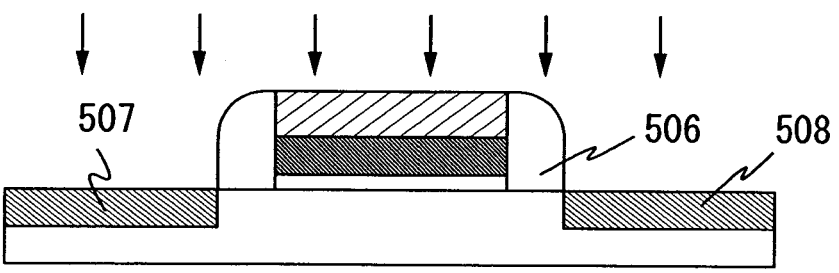

After that, a sidewall 506 is formed with silicon oxide using a known anisotropic etching technique as shown in FIG. 5D. By implanting the impurity by an ion implantation method or the like in such a state, a source region 507 and a drain region 508 are formed. Moreover, a first activation process is conducted to activate the implanted impurity ion and to recover a crystal defect of the silicon substrate caused by the ion implantation. The first activation process may be conducted by a known method such as an RTA method or a laser annealing method.

Figure 5E:
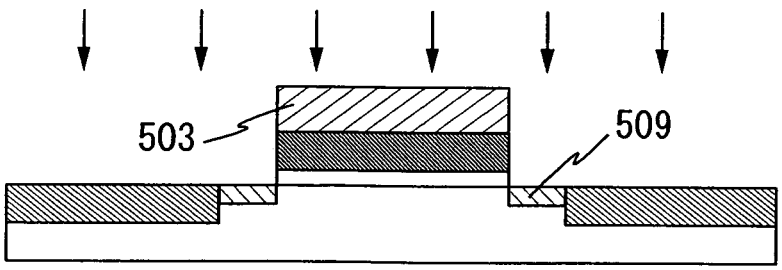

Next, as shown in FIG. 5E, an extension region 509 is formed by introducing an impurity very shallowly by a plasma doping method or the like. Since an N-type FET is formed in this embodiment, an N-type impurity such as arsenic (As), phosphorus (P), or antimony (Sb) is introduced. In the case of manufacturing a P-type FET, boron (B), which is a P-type impurity, is introduced. Here, the concentration of the impurity implanted in the extension region 509 may be lower than, the same as, or higher than that of the source region 507 and the drain region 508. That is to say, the impurity concentration of the extension region 509 may be determined based on a characteristic required in a semiconductor device.

At this time, an element having large mass number such as germanium (Ge) or a zeroth element (Ar, Kr, Xe, Rn, or the like) is implanted to break a single crystal lattice. At the implantation, the implantation speed is decreased to make the extension region 509 amorphous approximately 20 nm in depth. The order of the impurity introduction and the implantation of the element having large mass number is not limited. Either one may be conducted first, or they may be conducted at the same time. In any case, the impurity and the element having large mass number needs to be implanted into the same region.

In the single-crystal semiconductor substrate 500, atoms are arranged in order. In particular, in a <100> plane or a <111> plane of silicon, a phenomenon occurs in which the introduced impurity passes through a space between crystals to penetrate deep in the substrate (channeling phenomenon). Consequently, the impurity is implanted so that a direction in which the impurity is introduced is tilted to the single-crystal semiconductor substrate 500, which makes it possible to decrease the space between the atoms. Therefore, the introduced impurity stops at the vicinity of the surface of the crystal.

Since an uneven portion exists around the gate electrode 504, a region where the impurity and the element having large mass number are not introduced is likely to be formed (a shadow effect). In order to prevent the shadow effect, the impurity may be introduced while rotating the single-crystal semiconductor substrate 500 continuously or the impurity introduction and the rotation of the substrate may be conducted alternately. It is more preferable to implant the impurity and the element having large mass number in such a way that the implantation direction of the impurity and the element having large mass number is oblique relative to the single-crystal semiconductor substrate 500 and the single-crystal semiconductor substrate 500 is rotated, because the channeling phenomenon and the shadow effect can be prevented at the same time.

After that, the laser annealing is conducted according to the present invention in order to activate the introduced impurity element while keeping an ultrashallow and high-concentration profile.

In this embodiment, a $YVO_4$ laser having an energy of 10 W, a spatial profile of $TEM_{00}$ mode, a second harmonic (532 nm), a repetition rate of 160 MHz, and a pulse width of 10 ps is used. The irradiation condition is not limited to this, and a laser having a pulse width of 1 fs to 10 ps and a wavelength of 370 to 640 nm, preferably 400 to 540 nm, can be used because the absorption coefficient of an amorphous semiconductor is higher than that of a single-crystal semiconductor in a wavelength range of 370 to 640 nm as shown in FIG. 3. In particular, a large difference of the absorption coefficient is seen between the single-crystal semiconductor and the amorphous semiconductor in the wavelength range of 400 to 540 nm. Therefore, by using a laser having this wavelength range, the laser is easily absorbed selectively in the amorphous semiconductor.

The laser which can be used in the present invention is, for example, a laser in which a crystal of sapphire, YAG, ceramic YAG, ceramic $Y_2O_3$, KGW, KYW, $Mg_2SiO_4$, YLF, $YVO_4$, $GdVO_4$, or the like is doped with Nd, Yb, Cr, Ti, Ho, Er, or the like.

A laser beam emitted from the laser oscillator is converted into a harmonic such as a second harmonic, a third harmonic, or other higher harmonics by using a non-linear optical element, so that the laser beam has a wavelength of 370 to 640 nm, preferably 400 to 540 nm. For example, if the laser beam emitted from the laser oscillator has a fundamental wavelength of approximately 1 μm, which is in an infrared region, the laser beam can be converted into a second harmonic (approximately 532 mm) by a non-linear optical element and be used.

The laser oscillator desirably includes a stable resonator and has a spatial profile of $TEM_{00}$ (single transverse mode). In the case of $TEM_{00}$ mode, since the laser beam has Gaussian intensity distribution and has a high light-condensing property, its beam spot can be easily shaped.

Since a laser beam oscillated with a spatial profile of $TEM_{00}$ mode has Gaussian intensity distribution, an end portion of the laser beam has lower intensity than a central portion thereof. Therefore, the low-intensity portion is preferably blocked by a slit. By using the slit, the low-intensity portion of the laser beam can be blocked and the length of the laser beam in a major-axis direction on an irradiation surface can be adjusted. In the present invention, the existence or nonexistence of the slit and the material of the slit are not limited in particular. In the case of using the slit, the slit can have any structure and shape which can block the low-intensity portion of the laser beam when passing through the slit.

A beam homogenizer including a cylindrical lens, a cylindrical lens array, a fly-eye lens, a light pipe, a diffractive optical element (diffractive optics), or the like may be used to homogenize the beam. Moreover, both of the beam homogenizer and the slit can be used in combination.

The beam spot formed on the irradiation object can be changed into a desired shape by using an optical system. It is preferable to shape the beam into a linear, rectangular, or elliptical beam having a high aspect ratio because the beam can be delivered with high throughput.

The laser annealing is conducted in this way to activate the added impurity element at the same time as decreasing a crystal defect formed by adding the impurity. In this embodiment, by selecting the wavelength of 532 nm, the energy of the laser beam is absorbed only in the extension region 509 which has become amorphous, so that the extension region 509 can be selectively heated. Since the pulse width is as short as 1 fs to 10 ps, the diffusion of the impurity can be suppressed. Further, the process time can be shortened because the repetition rate is more than 10 MHz.

Thus, the extension region 509 can be kept shallow, and a semiconductor device manufactured according to the present invention can obtain advantages that a short-channel effect is suppressed, electric-field concentration is relaxed, and so on.

Figure 5F:
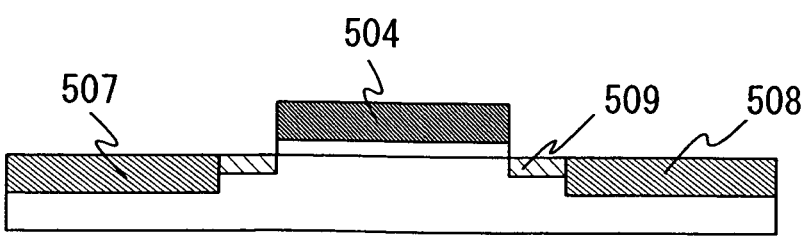

After that, as shown in FIG. 5F, the silicon nitride film 503 is selectively removed by etching. Moreover, a semiconductor device can be manufactured by conducting an appropriate step. The semiconductor device manufactured by the present invention has a favorable electric characteristic and a largely-improved operating characteristic.

This embodiment can be combined with another embodiment. Moreover, this embodiment can also be applied similarly when a thin film transistor is manufactured using an insulating substrate such as a glass substrate, a quartz substrate, or an organic resin substrate where a semiconductor film is formed.

Embodiment 3

Embodiment 3 will describe a method for manufacturing a semiconductor element with reference to FIGS. 6A to 8C. Specifically, Embodiment 3 will show an example of manufacturing a CMOS-type IC using a single-crystal silicon substrate.

First, a substrate 600 made of single-crystal silicon is prepared, and a first element forming region 602 and a second element forming region 603 are formed by a known LOCOS method or shallow trench isolation (STI) method.

Figure 6A:
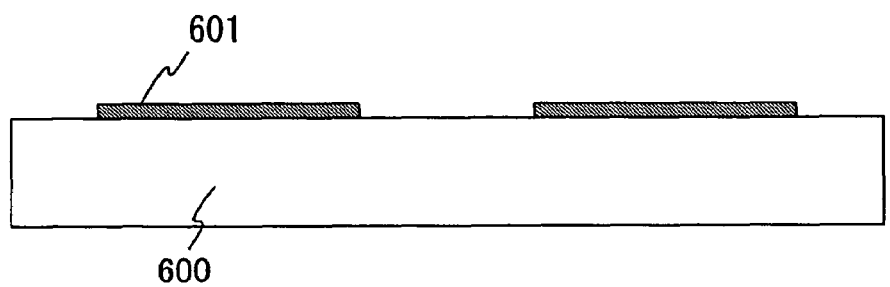
FIGS. 6A to 6F show Embodiment Mode of the present invention.

Specifically, a silicon nitride film 601 is deposited onto the single-crystal silicon substrate 600, and then the silicon nitride film 601 is removed while remaining a portion thereof which will become an active region (FIG. 6A).

Figure 6B:
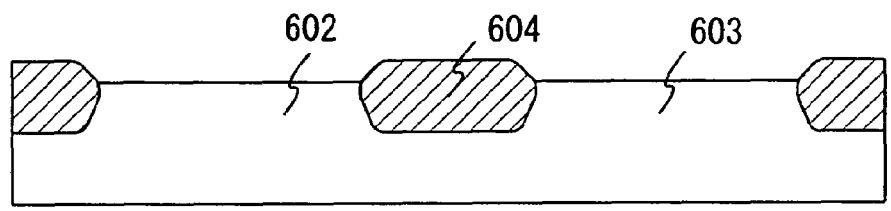

Then, the silicon nitride film 602 is used as a mask to form a thick silicon oxide film (field oxide film) 604 for separation by a thermal oxidation method. Next, the first element region 602 and the second element region 603 separated by the field oxide film 604 are formed by removing the silicon nitride film by thermal phosphoric acid (FIG. 6B).

The single-crystal semiconductor substrate 600 used here can be, for example, an SOI (Silicon On Insulator) substrate manufactured by a pasting method or a SIMOX (Separation by IMplanted OXygen) method or a silicon wafer. When a semiconductor element is manufactured by using an SOI substrate, the adjacent elements can be separated completely, thereby preventing the flowing of leak current.

Figure 6C:
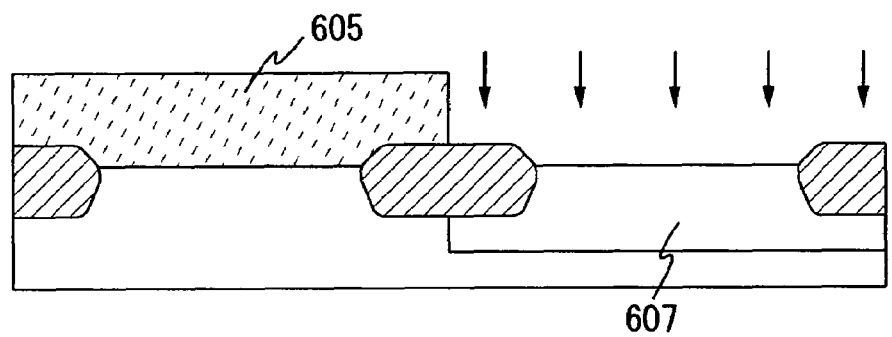

Next, the first element forming region 602 is covered with a resist 605, and then a phosphorus ion is implanted into the second element forming region 603 where a P-channel MOS transistor is to be formed, thereby forming a N-type well 607. Similarly, an P-type well 606 is formed in the first element forming region 602 where an N-channel MOS transistor is to be formed (FIG. 6C).

Figure 6D:
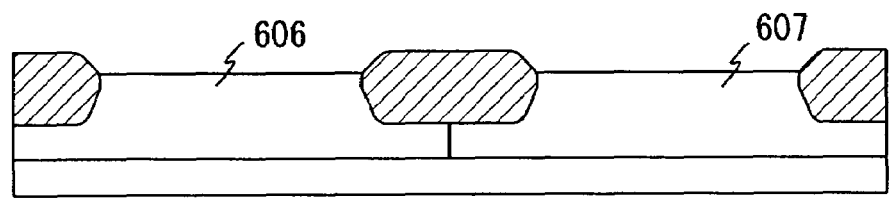
Figure 6E:
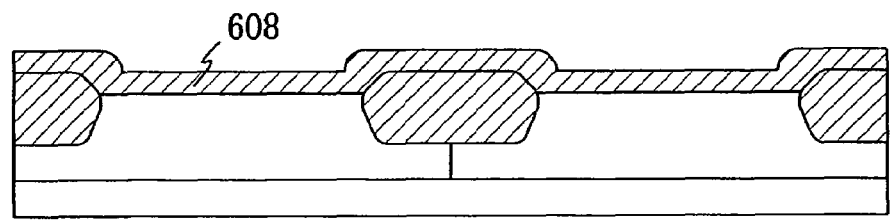

Next, the resist 605 is peeled to expose surfaces of the first element forming region 602 and the second element forming region 603 (FIG. 6D). After that, a thin gate insulating film 608 is formed with silicon oxide on these surfaces by a thermal oxidation method (FIG. 6E).

The gate insulating film 608 may be formed by a plasma CVD method, a sputtering method, or the like. For example, the gate insulating film 608 may be formed with a multilayer film in which a silicon oxide film with a thickness of 5 nm obtained by a thermal oxidation method and a silicon oxynitride film with a thickness of 10 to 15 nm obtained by a CVD method are stacked. These films can be formed continuously by switching gas.

In addition to the above material, the gate insulating film 608 can be formed with (1) a silicon oxide film, a silicon nitride oxide film ($SiN_xO_y$ (x and y are integer numbers of 1 or more, satisfying x>y)), a silicon oxynitride film ($SiN_xO_y$ (x and y are integer numbers of 1 or more, satisfying x<y)), a silicon nitride film, or a multilayer film of these, or (2) a high dielectric constant material (also referred to as a high-k material) such as tantalum nitride, hafnium oxide ($HfO_2$), nitrided hafnium silicate (HfSiON), zirconium oxide ($ZrO_2$), or aluminum oxide ($Al_2O_3$), or rare-earth oxide such as lanthanum oxide ($La_2O_2$).

Figure 6F:
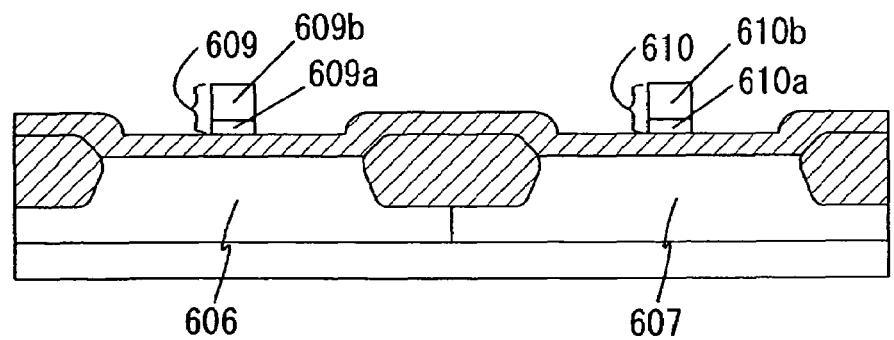

Next, a multilayer film of a poly-silicon layer and a silicide layer is formed all over the surface and is shaped into a desired form by a lithography technique and a dry etching technique. With this process, gate electrodes 609 and 610 having a polycide structure are formed over the gate insulating film 608 (FIG. 6F). In order to make the poly-silicon layers 609a and 610a low resistant, phosphorus (P) may be added at a concentration of approximately $1 \times 10^{21}$ atoms/cm$^3$ in advance or an N-type impurity such as phosphorus may be added when the poly-silicon layer is formed. The silicide layers 609b and 610b may be formed with molybdenum silicide ($MoSi_x$), tungsten silicide ($WSi_x$), tantalum silicide ($TaSi_x$), titanium silicide ($TiSi_x$), or the like by a known method.

In the case of using the above-mentioned high dielectric constant material (high-k material) to form the gate insulating film 608, the gate electrodes 609 and 610 are preferably formed with metal or a material containing metal as its main component. Specifically, metal selected from gold (Au), silver (Ag), copper (Cu), platinum (Pt), aluminum (Al), molybdenum (Mo), tungsten (W), titanium (Ti), and tantalum (Ta), or an alloy material of compound material containing any one of these elements as its main component may be used. Further, a multilayer of these materials may be used. As one example, a multilayer film including tungsten (W) and tantalum nitride (TaN) or a multilayer film including aluminum (Al) and molybdenum (Mo) is given. By forming the gate insulating film 608 and the gate electrodes 609 and 610 with these materials, depletion of the gate electrode can be reduced and a large amount of current can be flowed, which contributes to lower power consumption of a semiconductor element.

Figure 7A:
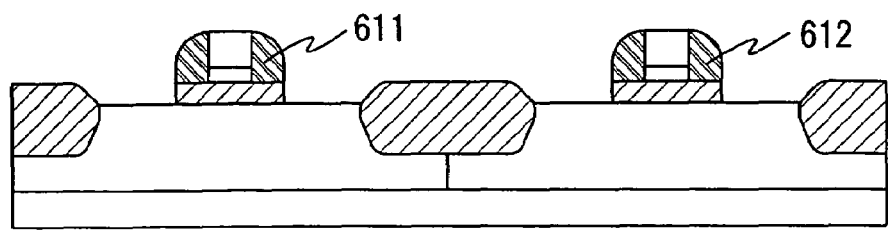
FIGS. 7A to 7E show Embodiment Mode of the present invention.

Next, as shown in FIG. 7A, sidewalls 611 and 612 are formed at side walls of the gate electrodes 609 and 610. For example, an insulating film including silicon oxide may be formed all over the surface of the substrate by a CVD method and this insulating film may be etched by anisotropic etching to form the sidewalls.

Figure 7B:
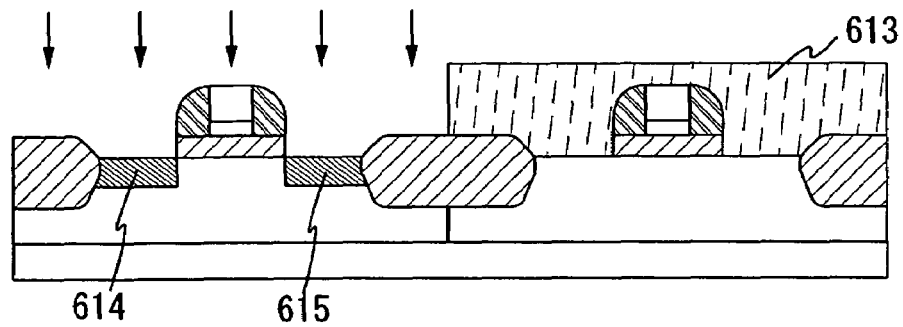
Figure 7C:
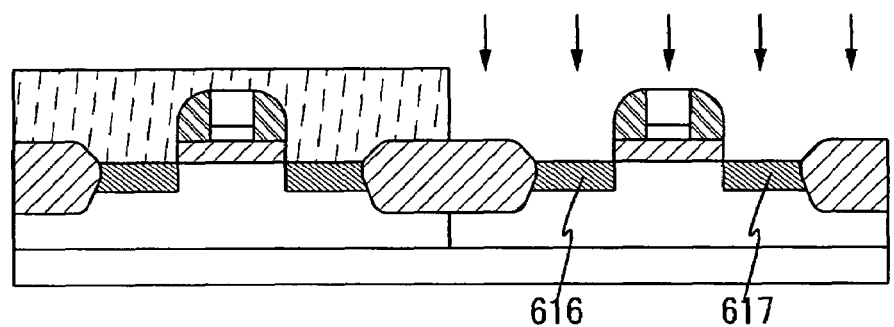

Subsequently, an ion is implanted into the silicon substrate in order to form a source region and a drain region (FIG. 7B). Since a CMOS circuit will be formed, the second element forming region 603 where a P-channel FET is to be formed is covered with a resist 613 and an N-type impurity such as arsenic (As), phosphorus (P), or antimony (Sb) is implanted into the first element forming region 602. By this operation, a source region 614 and a drain region 615 are formed. Similarly, the first element forming region 602 where an N-channel FET is to be formed is covered with a resist and boron (B), which is a P-type impurity, is implanted into the second element forming region 603 to form a source region 616 and a drain region 617 (FIG. 7C).

Moreover, in order to activate the implanted impurity ion and recover a crystal defect of the silicon substrate caused by the ion implantation, a first activation process is conducted. It is to be noted that the first activation process may be conducted by a known method such as an RTA method or a laser annealing method.

Figure 7D:
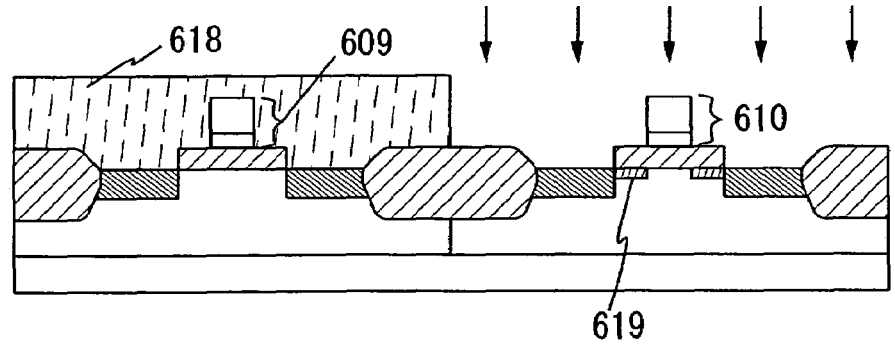

Next, the sidewalls 611 and 612 are selectively removed by an etching process or the like. Then, a portion to become an N-type FET is covered with a resist 618 and an ion imparting P-type conductivity is implanted (FIG. 7D). A boron ion can be used in the ion implantation. By this process, an extension region 619 is formed. Similarly, a portion to become a P-type FET is covered with a resist, and an ion imparting N-type conductivity is implanted to form an extension region 620. A phosphorus ion, an arsenic ion or an antimony ion can be used in the ion implantation. Here, the extension region means a region formed between the channel region and the source region or the drain region. The extension regions 619 and 620 are formed slightly shallower than the source regions 614 and 616 and the drain regions 615 and 617. The impurity concentration of the extension regions 619 and 620 may be lower than, the same as, or higher than that of the source region and the drain region. That is to say, the impurity concentration of the extension region may be determined based on a characteristic required in a semiconductor device.

Here, an element having large mass number such as germanium (Ge) or a zeroth element (Ar, Kr, Xe, Rn, or the like) is implanted at the same time as implanting the impurity element, so that a single crystal lattice is broken. At this time, the implantation speed is decreased to make each extension region amorphous approximately 20 nm in depth. The order of the impurity introduction and the implantation of the element having large mass number is not limited. Either one may be conducted first, or they may be conducted at the same time.

In the silicon substrate 600, atoms are arranged in order. In particular, in a <100> plane or a <111> plane of silicon, a phenomenon in which the introduced impurity passes through a space between crystals to penetrate deep in the substrate occurs (channeling phenomenon). Consequently, the impurity is implanted in such a way that a direction in which the impurity is introduced is tilted to the silicon substrate 600, which makes it possible to decrease the space between the atoms. Therefore, the introduced impurity is likely to stop at the vicinity of the surface of the crystal.

Further, since an uneven portion exists around the gate electrodes 609 and 610, a region where the impurity and the element having large mass number are not introduced is likely to be formed (referred to as a shadow effect). In order to prevent the shadow effect, the impurity may be implanted while rotating the silicon substrate 600 continuously or the impurity introduction and the rotation of the substrate may be conducted alternately. It is more preferable to implant the impurity and the element having large mass number in such a way that the implantation direction of the impurity and the element having large mass number is oblique relative to the silicon substrate 600 and the silicon substrate 600 is rotated, because the channeling phenomenon and the shadow effect can be prevented at the same time.

Figure 7E:
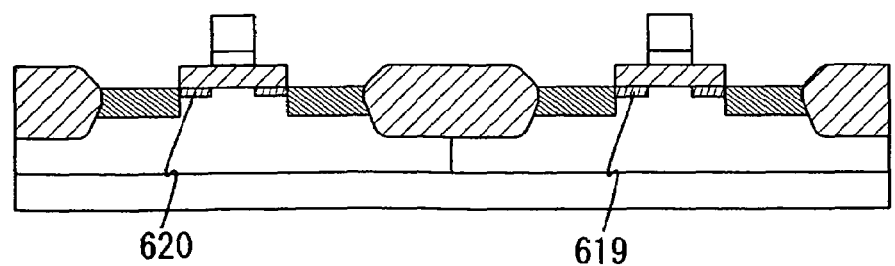

Next, a second activation process is conducted to activate the implanted impurity ion and recover a crystal defect of the silicon substrate caused by the ion implantation (FIG. 7E). In the second activation process, the extension region is activated by irradiating the semiconductor substrate that includes the extension region which has become amorphous with a laser beam having a pulse width of 1 fs to 10 ps and a wavelength of 370 to 640 nm, preferably 400 to 540 nm.

This is because the absorption coefficient of an amorphous semiconductor is much higher than that of a single-crystal semiconductor in a wavelength range of 370 to 640 nm, particularly 400 to 540 nm. Therefore, the laser beam in this wavelength range is absorbed almost selectively in the amorphous semiconductor. Accordingly, the laser beam is absorbed in the amorphous silicon film formed very shallowly from the source region and the drain region, that is, an ultrashallow region including the extension regions 619 and 620.

Since the laser used in this embodiment has an ultrashort pulse width of 1 fs to 10 ps, the time for which the extension region is heated can be shortened largely. Therefore, the diffusion of the impurity can be suppressed drastically as compared with an RTA method. With such a structure, an ultrashallow extension region can be formed, which makes it possible to relax electric-field concentration and to suppress a short-channel effect.

Further, the process time can be shortened by irradiating with a laser having a repetition rate of 10 MHz or more.

Figure 8A:
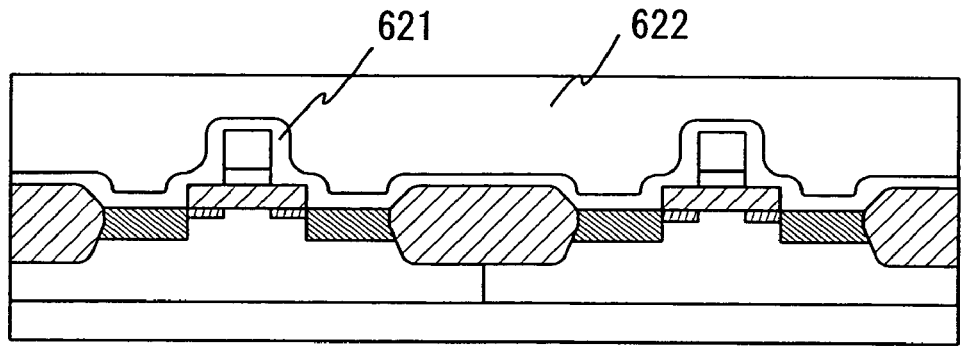
FIGS. 8A to 8C show Embodiment Mode of the present invention.

Next, an interlayer insulating film, a wiring, and the like are formed after the activation. As shown in FIG. 8A, a first interlayer insulating film 621 is formed with a silicon oxide film, a silicon oxynitride film, or the like by a plasma CVD method or a low-pressure CVD method in thickness from 100 to 2000 nm. Then, a second interlayer insulating film 622 is formed with phosphosilicate glass (PSG), borosilicate glass (BSG), or phosphoborosilicate glass (PBSG) over the first interlayer insulating film 621. The second interlayer insulating film 622 is formed by a spin coating method or a normal-pressure CVD method in order to increase the flatness.

Figure 8B:
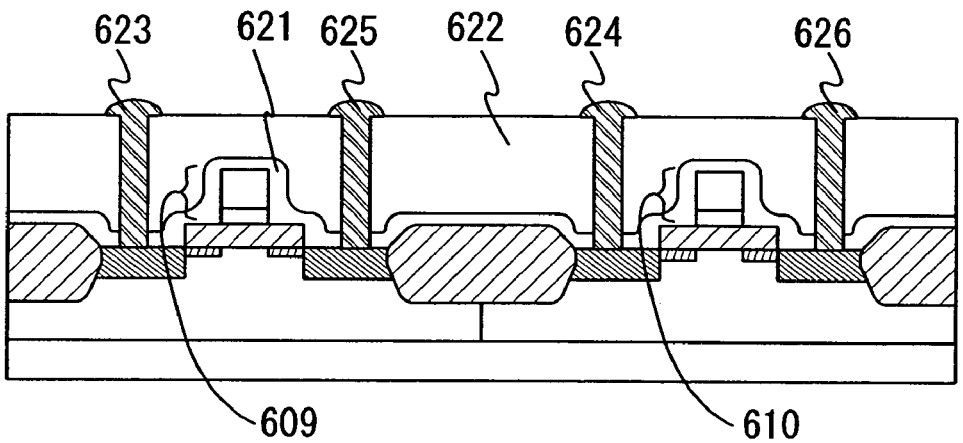

Subsequently, as shown in FIG. 8B, contact holes (openings) which reach the source region and the drain region are formed in the first interlayer insulating film 621 and the second interlayer insulating film 622, and then source electrodes 623 and 624 and drain electrodes 625 and 626 are formed. The source electrodes 623 and 624 and the drain electrodes 625 and 626 can be formed with aluminum (Al) which is usually used as a low-resistant material, a multilayer film of aluminum and titanium (Ti), or the like.

Although not shown here, other contact holes which reach the gate electrodes 609 and 610 are also formed in the first interlayer insulating film 621 and the second interlayer insulating film 622 at the same time as forming the contact holes for forming the source electrodes 623 and 624 and the drain electrodes 625 and 626, so that an electrode which electrically connects to a wiring provided over the first interlayer insulating film 621 is provided.

Figure 8C:
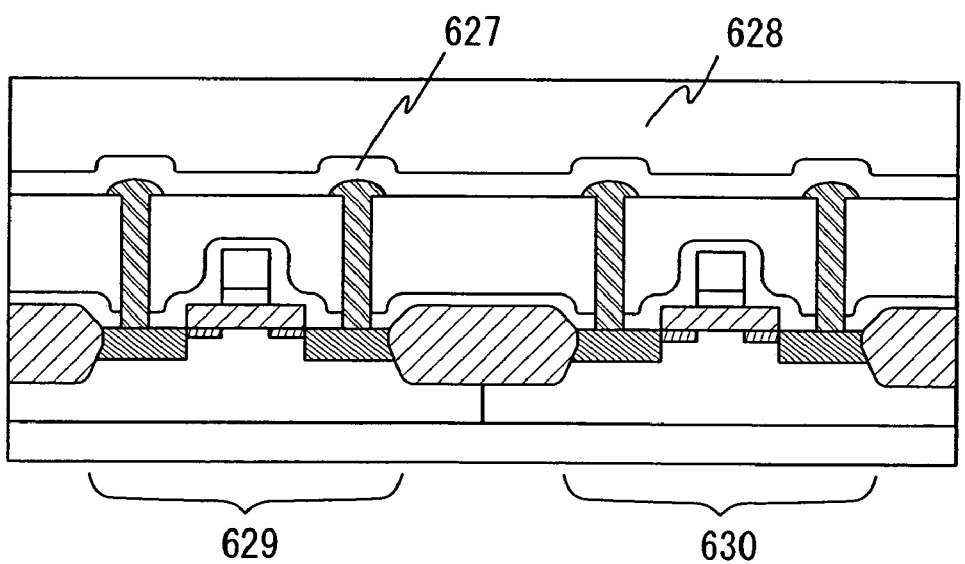

Finally, a passivation film 627 and a third interlayer insulating film 628 are formed as shown in FIG. 8C. In FIG. 8C, an N-channel FET 629 is on the left side and a P-channel FET 630 is on the right side.

The passivation film 627 is formed with a silicon nitride film, a silicon oxide film, or a silicon nitride oxide film by a plasma CVD method. Moreover, the third interlayer insulating film 628 is formed with an organic resin material in thickness of 1 to 2 μm. The organic resin material to be used here is polyimide, polyamide, acrylic, benzocyclobutene (BCB), or the like. The advantages in using the organic resin film are that the film can be easily formed, a parasitic capacitance can be decreased because a specific dielectric constant is low, the film can be easily flattened, and so on. Other organic resin films than the above films may also be used.

According to the present invention, a short-channel effect is suppressed and electric-field concentration is relaxed by forming the extension region very shallowly. Therefore, a compact semiconductor device which operates at high speed and has favorable performance can be manufactured.

Embodiment 3 can be freely combined with Embodiment Mode and another Embodiment.

Embodiment 4

Various semiconductor devices can be completed by using a MOSFET manufactured by the present invention. Embodiment 4 shows an example of a CPU using a MOSFET of the present invention.

Figure 9:
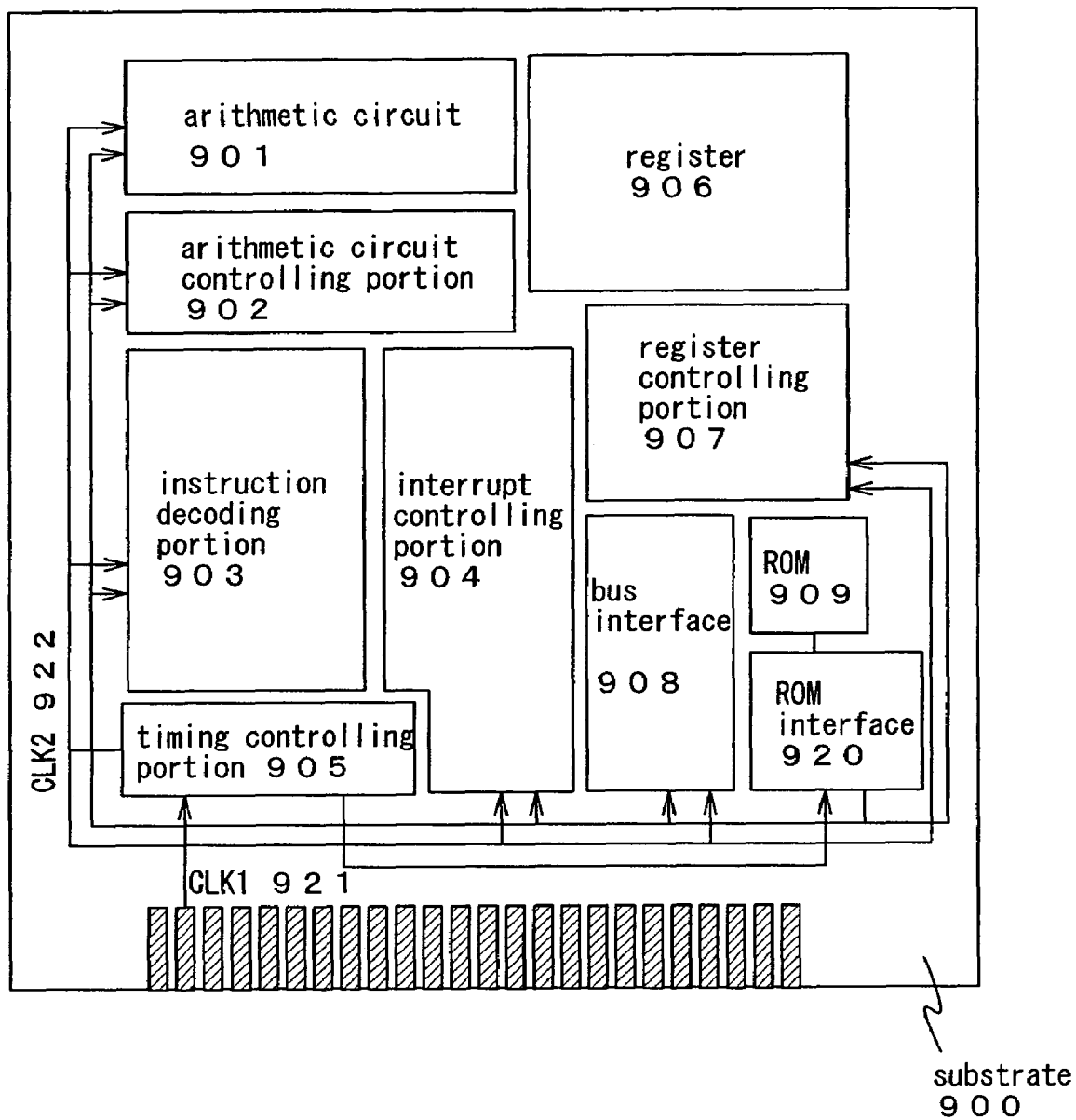
FIG. 9 shows Embodiment Mode of the present invention.

A CPU shown in FIG. 9 mainly includes, over a substrate 900, an arithmetic circuit (ALU: Arithmetic Logic Unit) 901, an arithmetic circuit controlling portion (ALU controller) 902, an instruction decoding portion (instruction decoder) 903, an interrupt controlling portion (interrupt controller) 904, a timing controlling portion (timing controller) 905, a register 906, a register controlling portion (register controller) 907, a bus interface (Bus I/F) 908, a rewritable ROM 909, and a ROM interface (ROM I/F) 920. The ROM 909 and the ROM interface (ROM I/F) 920 may be provided to another chip.

The CPU shown in FIG. 9 is just an example in which the structure is simplified. Actual CPUs have various structures in accordance with their intended purposes.

An instruction inputted into the CPU through the Bus I/F 908 is inputted into the instruction decoder 903. After the instruction is decoded thereby, the instruction is inputted into the ALU controller 902, the interrupt controller 904, the register controller 907, and the timing controller 905.

The ALU controller 902, the interrupt controller 904, the register controller 907, and the timing controller 905 conduct various controls based on the decoded instruction. Specifically, the ALU controller 902 generates a signal for controlling the operation of the ALU 901. The interrupt controller 904 processes an interrupt request from an external input/output device or from a peripheral circuit by judging from the priority or the mask condition during the execution of a program by the CPU. The register controller 907 generates an address of the register 906, and reads and writes the register 906 in accordance with the condition of the CPU.

The timing controller 905 generates a signal for controlling the timing to operate the ALU 901, the ALU controller 902, the instruction decoder 903, the interrupt controller 904, and the register controller 907. For example, the timing controller 905 is equipped with an internal clock generator for generating an internal clock signal CLK2 (922) based on a standard clock signal CLK1 (921) and supplies the clock signal CLK2 to the above circuits.

When a MOSFET for constituting the CPU is manufactured by the present invention, an extension region can be formed shallowly. Therefore, a short-channel effect can be suppressed and electric-field concentration is relaxed, so that a stable CPU can be obtained. Moreover, further size reduction of a CPU can be promoted.

Embodiment 4 can be freely combined with Embodiment Mode and another Embodiment.

Embodiment 5

By mounting integrated MOSFETs which are manufactured by the present invention as a CPU, various electronic appliances can be completed.

Such electronic appliances include a camera such as a digital video camera or a digital camera, a reflective projector, a television (display), a goggle-type display (head mount display), a navigation system, a sound reproducing device (audio), a mobile terminal (a mobile computer, a mobile phone, a mobile game machine, an electronic book, or the like), a game machine, an image reproducing device equipped with a recording medium (specifically, an appliance having a CPU and a display which reproduces information recorded in a recording medium such as a digital versatile disk (DVD) or a hard disk drive (HDD) and which displays the image, and so on.

A mobile phone as one electronic appliance of the present invention is described hereinafter.

Figure 10:
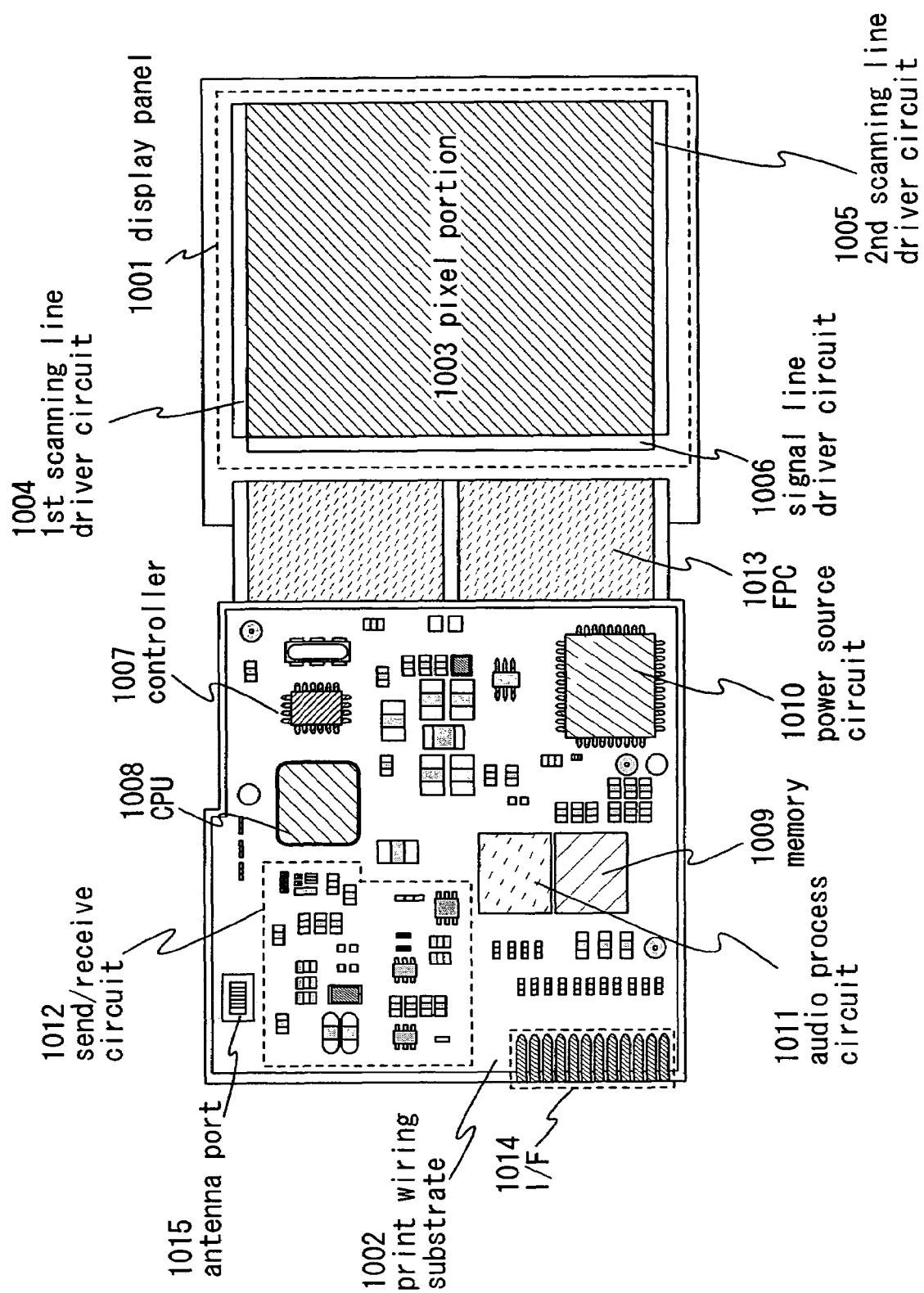
FIG. 10 shows Embodiment Mode of the present invention.

FIG. 10 shows a module in which a display panel 1001 and a print wiring substrate 1002 are combined. The display panel 1001 is equipped with a pixel portion 1003 in which a light-emitting element is provided in each pixel, a first scanning line driver circuit 1004, a second scanning line driver circuit 1005, and a signal line driver circuit 1006 for supplying a video signal to the selected pixel. An element used for the display panel is not limited to a light-emitting element, and a liquid crystal element may be used.

The print substrate 1002 is equipped with a controller 1007, a central processing unit (CPU) 1008, a memory 1009, a power source circuit 1010, an audio process circuit 1011, and a send/receive circuit 1012, and the like. The print substrate 1002 and the display panel 1001 are connected by a flexible wiring substrate (FPC) 1013. In the print wiring substrate 1013, a capacitor element, a buffer circuit, and the like may be provided in order to prevent a noise in a power source voltage and a signal and a dull rise of a signal. The controller 1007, the audio process circuit 1011, the memory 1009, the CPU 1008, the power source circuit 1010, and the like can be mounted onto the display panel 1001 by a COG (Chip On Glass) method. The scale of the print substrate 1002 can be decreased by a COG method.

Various control signals are inputted/outputted through an interface (I/F) portion 1014 provided in the print substrate 1002. In order to send and receive a signal between the print substrate 1002 and an antenna, an antenna port 1015 is provided to the print substrate 1002.

Figure 11:
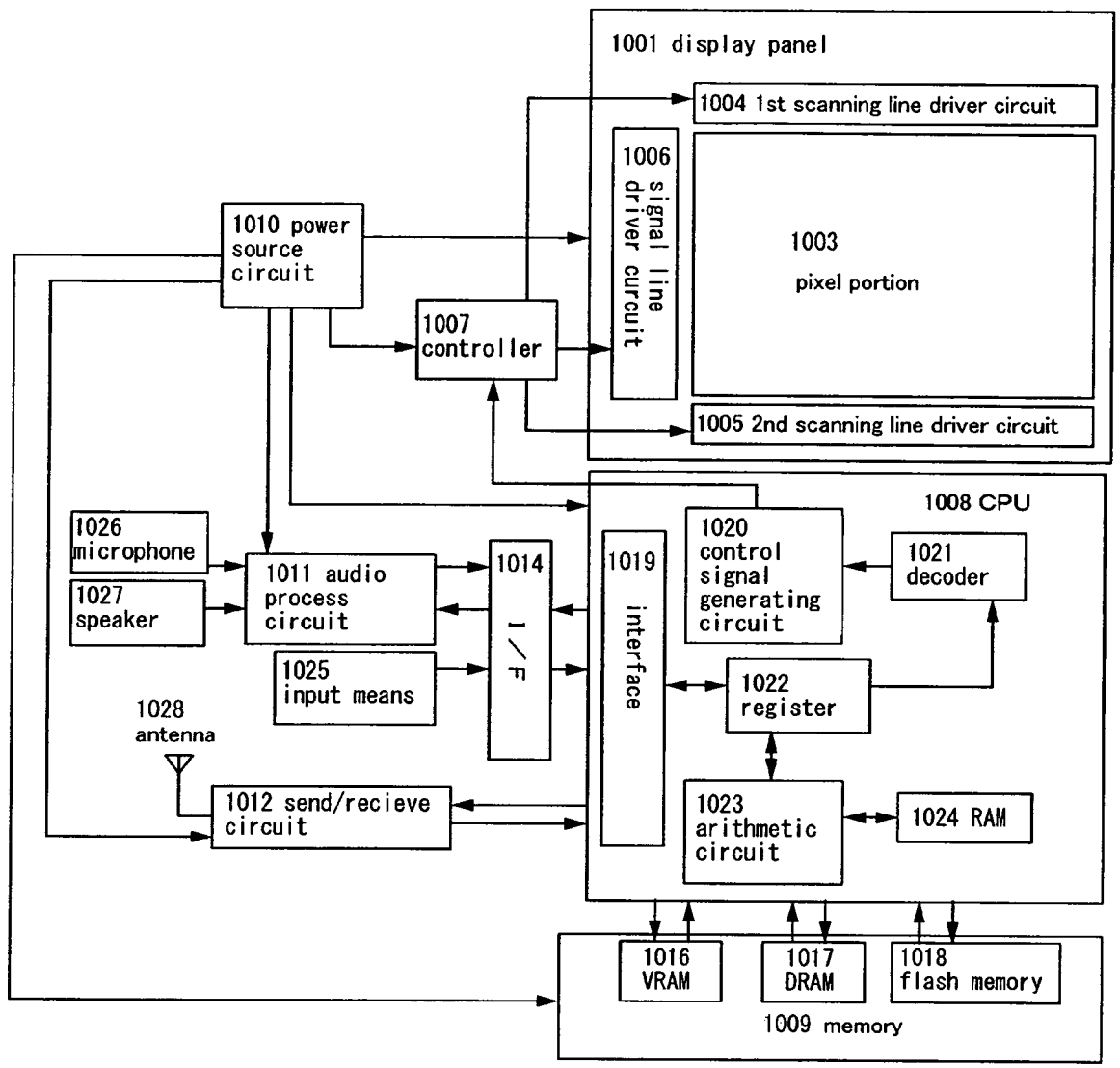
FIG. 11 shows Embodiment Mode of the present invention.

FIG. 11 is a block diagram of the module shown in FIG. 10. This module includes a VRAM 1016, a DRAM 1017, a flash memory 1018, and the like as a memory 1009. Image data which will be displayed in the panel are stored in the VRAM 1016, and image data or audio data are stored in the DRAM 1017, and various programs are stored in the flash memory 1018.

The power source circuit 1010 supplies electric power for operating the display panel 1001, the controller 1007, the CPU 1008, the audio process circuit 1011, the memory 1009, and the send/receive circuit 1012. The power source circuit 1010 may be provided with a current source depending on a specification of the panel.

The CPU 1008 has a control signal generating circuit 1020, a decoder 1021, a register 1022, an arithmetic circuit 1023, a RAM 1024, an interface 1019 for the CPU 1008, and the like. Various signals inputted into the CPU 1008 through the interface 1019 are held in the register 1022 once, and then inputted into the arithmetic circuit 1023, the decoder 1021, and the like. The arithmetic circuit 1023 conducts arithmetic based on the inputted signal, and specifies a place to send various instructions to. Meanwhile, the signal inputted into the decoder 1021 is decoded and inputted into the control signal generating circuit 1020. The control signal generating circuit 1020 generates a signal including various instructions based on the inputted signal, and sends the signal to the place specified by the arithmetic circuit 1023, specifically the memory 1009, the send/receive circuit 1012, the audio process circuit 1011, the controller 1007, and the like.

The memory 1009, the send/receive circuit 1012, the audio process circuit 1011, and the controller 1007 operate in accordance with the received instruction. The operation is hereinafter described briefly.

The signal inputted from an input means 1025 is sent to the CPU 1008 mounted onto the print substrate 1002 through the interface 1014. The control signal generating circuit 1020 converts the image data stored in the VRAM 1016 into a predetermined format in accordance with the signal sent from the input means 1025 such as a pointing device or a keyboard and sends the data to the controller 1007.

The controller 1007 processes data of the signal including the image data which has been sent from the CPU 1008 in accordance with the specification of the panel, and supplies the signal to the display panel 1001. Further, the controller 1007 generates a Hsync signal, a Vsync signal, a clock signal CLK, an alternating voltage (AC Cont), and a switching signal L/R based on the power source voltage inputted from the power source circuit 1010 or the signals inputted from the CPU 1008 and supplies them to the display panel 1001.

The send/receive circuit 1012 processes a signal to be sent or received as an electric wave in an antenna 1028. Specifically, a high-frequency circuit such as an isolator, a bandpass filter, a VCO (Voltage Controlled Oscillator), an LPF (Low Pass Filter), a coupler, or a balun is included. Among the signals to be sent or received in the send/receive circuit 1012, a signal including audio information is sent to the audio process circuit 1011 in accordance with the instruction from the CPU 1008.

The signal including the audio information which has been sent in accordance with the instruction of the CPU 1008 is demodulated into an audio signal in the audio process circuit 1011 and sent to a speaker 1027. An audio signal sent from a microphone 1026 is modulated in the audio process circuit 1011 and sent to the send/receive circuit 1012 in accordance with the instructions from the CPU 1008.

The controller 1007, the CPU 1021, the power source circuit 1010, the audio process circuit 1011, and the memory 1009 can be mounted as a package of this embodiment. This embodiment can be applied to any kind of circuit except a high-frequency circuit such as an isolator, a bandpass filter, a VCO (Voltage Controlled Oscillator), an LPF (Low Pass Filter), a coupler, or a balun.

A semiconductor element manufactured by the present invention has advantages that a short-channel effect is suppressed, electric-field concentration is relaxed, and so on. Therefore, when a CPU is manufactured by integrating this semiconductor element, a compact CPU which can operate favorably with low power consumption can be manufactured. Accordingly, this CPU can be used for a compact electronic appliance in which the CPU is required to be disposed in a limited area.

Embodiment 5 can be combined with Embodiment Mode and another Embodiment.

Embodiment 6

By mounting an IC in which an FET manufactured by the present invention is integrated, various electronic appliances can be completed. Specific examples are described with reference to FIGS. 12A to 13B.

By the present invention, an extension region in an FET over a substrate can be formed shallowly; therefore, a short-channel effect can be suppressed and electric-field concentration can be relaxed. Thus, a semiconductor device manufactured according to the present invention has a favorable electric characteristic and a largely-improved operating characteristic.

Figure 12A:
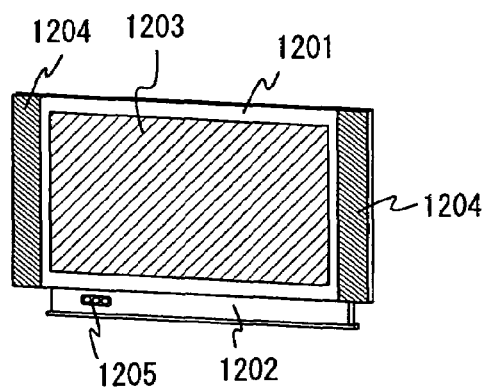
FIGS. 12A to 12F show examples of electronic appliances manufactured by the present invention.

FIG. 12A shows a display device including a case 1201, a supporting stand 1202, a display portion 1203, a speaker portion 1204, a video input portion 1205, and the like. This display device is manufactured by applying an FET formed by the manufacturing method shown in another Embodiment in a driver IC. The display device includes a liquid crystal display device and a light-emitting display device. Specifically, all the display devices for a computer, television reception, advertisement display, and so on are included.

Figure 12B:
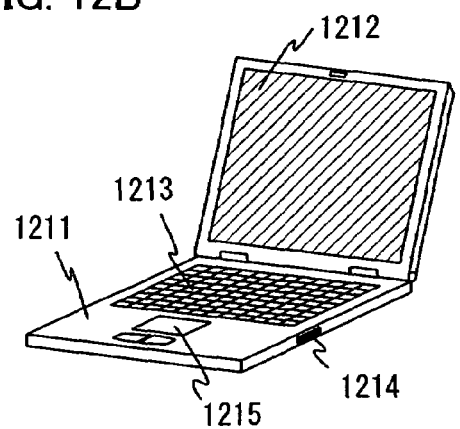

FIG. 12B shows a computer including a case 1211, a display portion 1212, a keyboard 1213, an external connection port 1214, a pointing mouse 1215, and the like. An FET formed according to the present invention can be applied to a semiconductor device such as a driver IC for display, a CPU in the main body, or a memory.

Figure 12C:
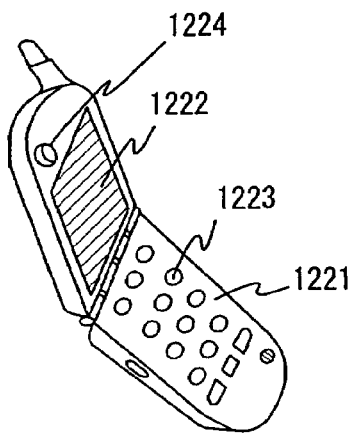

FIG. 12C shows a mobile phone as one typical example of mobile terminals. This mobile phone includes a case 1221, a display portion 1222, an operation key 1223, and the like. An FET formed according to the present invention can be applied to a driver IC for display, a memory, an audio process circuit, or the like. Moreover, a sensor portion 1224 has a photo sensor element which controls luminance intensity of the display portion 1222 and the operation key 1223 in accordance with illuminance intensity obtained by the sensor portion 1224, whereby the power consumption of the mobile phone can be suppressed.

In addition to the above mobile phone, a semiconductor material to which laser irradiation of the present invention has been conducted can be used for an electronic appliance such as a PDA (Personal Digital Assistant), a digital camera, or a compact game machine. For example, a compact and light-weight functional circuit such as a CPU, a memory, or a sensor can be formed. Since each functional circuit has advantages that a short-channel effect is suppressed and electric-field concentration is relaxed, the power consumption can be decreased, power consumption can be decreased.

Figure 12D:
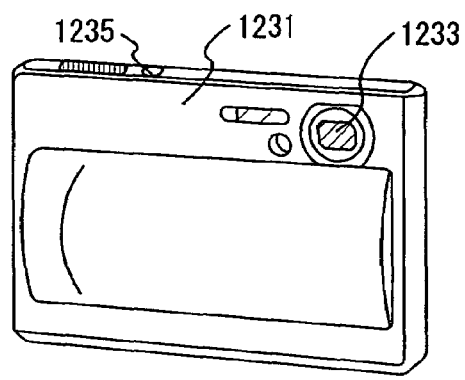
Figure 12E:
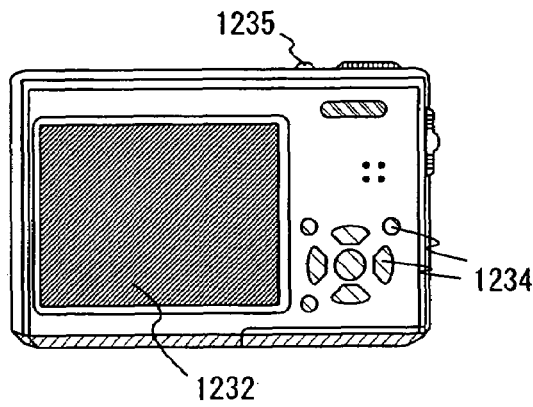

FIGS. 12D and 12E show a digital camera. FIG. 12E shows a rear side of FIG. 12D. This digital camera includes a case 1231, a display portion 1232, a lens 1233, an operation key 1234, a shutter 1235, and the like. An FET formed according to the present invention can be used for a memory, a driver IC for driving the display portion 1232, and the like.

Figure 12F:
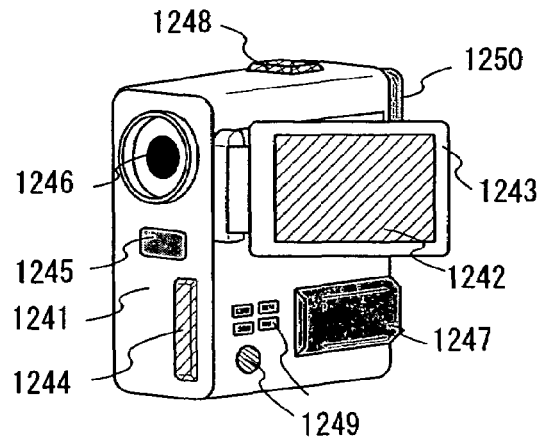

FIG. 12F shows a digital video camera including a main body 1241, a display portion 1242, a case 1243, an external connection port 1244, a remote control receiving portion 1245, an image receiving portion 1246, a battery 1247, an audio input portion 1248, an operation key 1249, an eyepiece portion 1250, and the like. An FET formed according to the present invention can be used for a digital input process device, a memory, a driver IC for driving the display portion 1242, and the like.

An FET manufactured by the present invention can be used for a thin film integrated circuit or a contactless thin film integrated circuit device (also referred to as a wireless IC tag or an RFID (Radio Frequency Identification)). By employing the manufacturing method shown in another Embodiment, the thin film integrated circuit and the contactless thin film integrated circuit can be used as a tag or a memory.

Figure 13A:
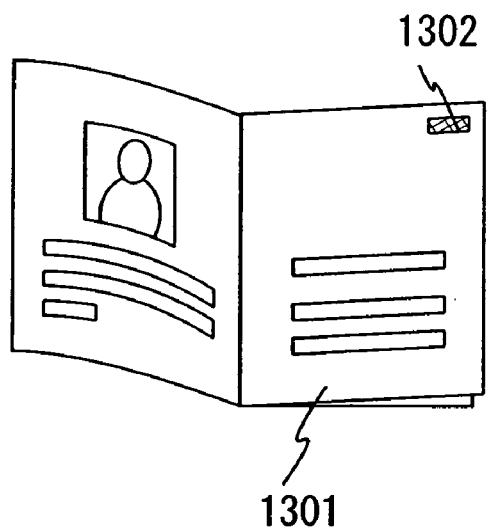
FIGS. 13A and 13B show examples of electronic appliances manufactured by the present invention.

FIG. 13A shows a passport 1301 with a wireless IC tag 1302 attached thereto. Alternatively, the wireless IC tag 1302 may be embedded in the passport 1301. Similarly, the wireless IC tag can be attached or embedded in a driver's license, a credit card, a banknote, a coin, a certificate, a merchandise coupon, a ticket, a traveler's check (T/C), a health insurance card, a resident card, a family register, and the like. In this case, only the information saying this is the real one is inputted in the wireless IC tag and an access authority is set so that the information cannot be read and written illegally. This can be achieved by using the memory shown in another Embodiment. By using the tag in this way, it is possible to distinguish the forged one and the real one.

Figure 13B:
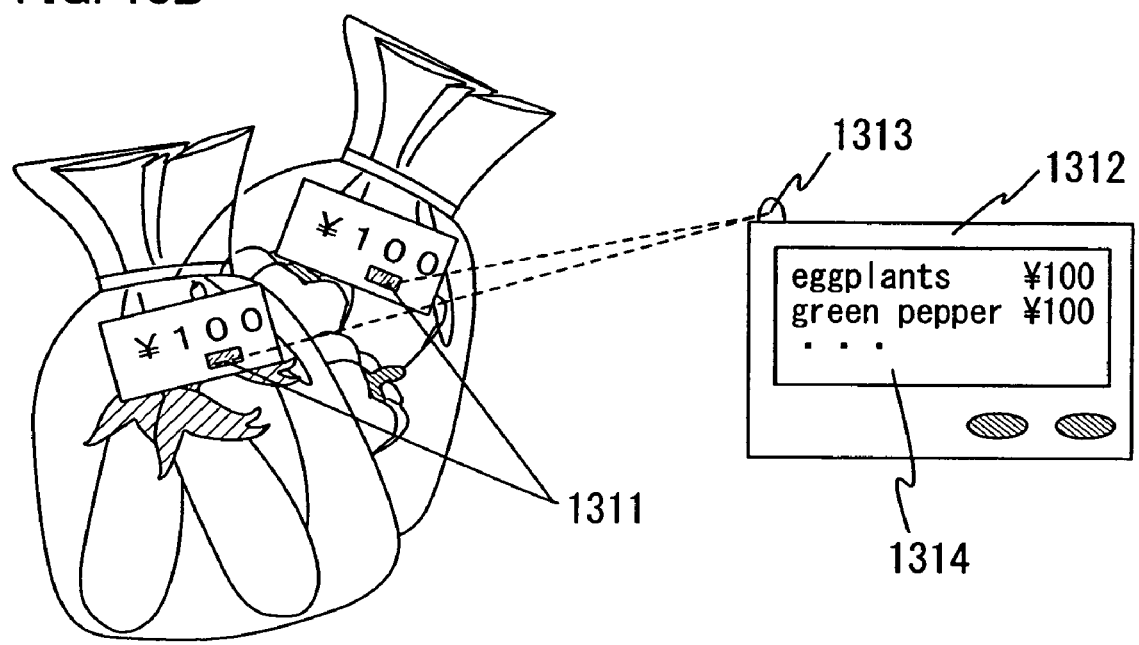

Besides, the wireless IC tag can be used as a memory. FIG. 13B shows an example of using a wireless IC tag 1311 for a label to be attached to a package of vegetables. Alternatively, the wireless IC tag may be attached directly to the package or embedded in the package. In the wireless IC tag 1311, a production area, a producer, a manufacturing date, and a process at a production stage such as a process method, a circulation process of the product, a price, quantity, an intended purpose, a shape, weight, an expiration date, each kind of authentication information, and the like can be recorded. Information from the wireless IC tag 1311 is received by an antenna portion 1313 of a wireless reader 1312 and read out, and displayed in a display portion 1314 of the reader 1312. Thus, wholesalers, retailers, and consumers can know the information easily. Moreover, access authority can be set for each of producers, traders, and consumers. Those who do not have the access authority cannot read, write, rewrite, and erase the data in the wireless IC tag.

The wireless IC tag can be used in the following way. At the settlement, the information that the settlement has been made is written in the wireless IC tag, and the wireless IC tag is checked by a checking means provided at an exit whether or not the information that the settlement has been made is written in the wireless IC tag. If the IC tag is brought out from the store without making the settlement, the alarm rings. With this method, forgetting of the settlement and shoplifting can be prevented.

In consideration of protecting customer's privacy, the following method is also possible. At the settlement at a cash register, any of the followings is conducted; (1) data inputted in the wireless IC tag is locked by pin numbers or the like, (2) data itself inputted in the wireless IC tag are encrypted, (3) data inputted in the wireless IC tag is erased, and (4) data inputted in the wireless IC tag are destroyed. This can be achieved by using the memory shown in another Embodiment. Then, a checking means is provided at an exit, and whether any one of (1) to (4) has been conducted or whether the data in the wireless IC tag are not processed is checked so that whether the settlement has been made or not is checked. In this way, whether the settlement has been made or not can be checked in the store, and reading out the information in the wireless IC tag against the owner's will outside the store can be prevented.

Several methods are given to destroy data inputted in the wireless IC tag in (4). For example, (a) only data are destroyed by writing one or both of "0 (off)" and "1 (on)" in at least a part of electronic data in the wireless IC tag, and (b) current is flowed excessively in the wireless IC tag to physically destroy a part of a wiring in a semiconductor element in the wireless IC tag.

Since manufacturing cost of these wireless IC tags mentioned above is higher than that of conventionally used barcodes, the cost reduction is necessary. According to the present invention, however, further size reduction can be promoted while suppressing a short-channel effect and a small IC chip provided in a wireless IC tag can be achieved. Since a smaller IC chip has higher impact resistance, the reliability increases. Furthermore, by using the present invention, the wireless IC tags can be manufactured so that any wireless IC tag has high quality and no variation of performance.

As thus described, the semiconductor device manufactured by the present invention can be applied to a wide range, and the semiconductor device manufactured by the present invention can be applied to electronic appliances of every field.

Moreover, since a semiconductor integrated circuit can be reduced in size further by the present invention, higher integration of ICs can be promoted. For this reason, the number of chips taken from one wafer can be increased.

Embodiment 6 can be combined with Embodiment Mode and another Embodiment.

What is claimed is:

1. A method for manufacturing a semiconductor device, comprising:
   forming a gate electrode over a semiconductor substrate;
   forming a source region and a drain region by introducing a first impurity element selectively into a region in the semiconductor substrate which is a certain distance apart from the gate electrode;
   forming an extension region by introducing a second impurity element into a region in the semiconductor substrate which includes spaces between the gate electrode and the source region and between the gate electrode and the drain region; and
   irradiating at least the extension region with a laser beam having a pulse width of 1 fs to 10 ps.

2. The method for manufacturing a semiconductor device according to claim 1, wherein the laser beam has a repitition rate of 10 MHz or more.

3. The method for manufacturing a semiconductor device according to claim 1, wherein the laser beam is emitted from a laser oscillator in which a crystal of sapphire, YAG, ceramic YAG, ceramic $Y_2O_3$, KGW, KYW, Mg2SiO4, YLF, $YVO_4$GdVO$_4$, or the like is doped with Nd, Yb, Cr, Ti, Ho, Er, or the like.

4. The method for manufacturing a semiconductor device according to claim 1, wherein the semiconductor substrate is an N-type or P-type single-crystal semiconductor substrate, a GaAs substrate, an lnP substrate, a GaN substrate, a SiC substrate, a sapphire substrate, a ZnSe substrate, or a substrate manufactured by a pasting method or a SIMOX (Separation by IMPlanted OXygen) method.

5. The method for manufacturing a semiconductor device according to claim 1, wherein the semiconductor substrate is a substrate made of an insulating material such as glass, quartz, or synthetic resin where a single-crystal semiconductor film is formed.

6. The method for manufacturing a semiconductor device according to claim 1, wherein the extension region is formed shallower than the source region and the drain region.

7. The method for manufacturing a semiconductor device according to claim 6, wherein the extension region is formed 0.1 to 20 nm in depth.

8. The method for manufacturing a semiconductor device according to claim 1, wherein arsenic or phosphorus is used as the first impurity element and the second impurity element.

9. The method for manufacturing a semiconductor device according to claim 1, wherein boron is used as the first impurity element and the second impurity element.

10. The method for manufacturing a semiconductor device according to claim 1, wherein the semiconductor device is applied to a CPU, a memory, or an IC.

11. The method for manufacturing a semiconductor device according to claim 10, wherein at least one of the CPU, the memory and the IC are applied to an electronic appliance selected from the group consisting of a digital video camera, a digital camera, a reflective projector, a display, a head mount display, a navigation system, a sound reproducing device, a mobile terminal, a game machine, and an image reproducing device equipped with a recording medium.

12. The method for manufacturing a semiconductor device according to claim 1, wherein the laser beam has a wavelength of 370 to 640 nm.

13. A method for manufacturing a semiconductor device, comprising:
    forming a gate electrode over a semiconductor substrate;
    forming a source region and a drain region by introducing a first impurity element selectively into a first region in the semiconductor substrate which is a certain distance apart from the gate electrode;
    forming an extension region by introducing a second impurity element into a second region in the semiconductor substrate between the gate electrode and the first region and then introducing germanium, argon, krypton, xenon, or radon; and
    irradiating at least the extension region with a laser beam having a pulse width of 1 fs to 10 ps.

14. The method for manufacturing a semiconductor device according to claim 13, wherein the laser beam has a repetition rate of 10 MHz or more.

15. The method for manufacturing a semiconductor device according to claim 13, wherein the laser beam is emitted from a laser oscillator in which a crystal of sapphire, YAG, ceramic YAG, ceramic $Y_2O_3$, KGW, KYW, $Mg_2SiO_4$, YLF, $YVO_4$, $GdVO_4$, or the like is doped with Nd, Yb, Cr, Ti, Ho, Er, or the like.

16. The method for manufacturing a semiconductor device according to claim 13, wherein the semiconductor substrate is an N-type or P-type single-crystal semiconductor substrate, a GaAs substrate, an lnP substrate, a GaN substrate, a SiC substrate, a sapphire substrate, a ZnSe substrate, or a substrate manufactured by a pasting method or a SIMOX (Separation by IMPlanted OXygen) method.

17. The method for manufacturing a semiconductor device according to claim 13, wherein the semiconductor substrate is a substrate made of an insulating material such as glass, quartz, or synthetic resin where a single-crystal semiconductor film is formed.

18. The method for manufacturing a semiconductor device according to claim 13, wherein the extension region is formed shallower than the source region and the drain region.

19. The method for manufacturing a semiconductor device according to claim 18, wherein the extension region is formed 0.1 to 20 nm in depth.

20. The method for manufacturing a semiconductor device according to claim 13, wherein arsenic or phosphorus is used as the first impurity element and the second impurity element.

21. The method for manufacturing a semiconductor device according to claim 13, wherein boron is used as the first impurity element and the second impurity element.

22. The method for manufacturing a semiconductor device according to claim 13, wherein the semiconductor device is applied to a CPU, a memory, or an IC.

23. The method for manufacturing a semiconductor device according to claim 22, wherein at least one of the CPU, the memory and the IC are applied to an electronic appliance selected from the group consisting of a digital video camera, a digital camera, a reflective projector, a display, a head mount display, a navigation system, a sound reproducing device, a mobile terminal a game machine, and an image reproducing device equipped with a recording medium.

24. The method for manufacturing a semiconductor device according to claim 13, wherein the laser beam has a wavelength of 370 to 640 nm.

25. A method for manufacturing a semiconductor device, comprising:
   forming a gate electrode over a semiconductor substrate;
   forming a source region and a drain region by introducing a first impurity element selectively into a first region in the semiconductor substrate which is a certain distance apart from the gate electrode;
   forming an extension region by introducing germanium, argon, krypton, xenon, or radon into a second region in the semiconductor substrate between the gate electrode and the first region and then introducing a second impurity element; and
   irradiating at least the extension region with a laser beam having a pulse width of 1 fs to 10 ps.

26. The method for manufacturing a semiconductor device according to claim 3, wherein the laser beam has a repetition rate of 10 MHz or more.

27. The method for manufacturing a semiconductor device according to claim 3, wherein the laser beam is emitted from a laser oscillator in which a crystal of sapphire, YAG, ceramic YAG, ceramic $Y_2O_3$, KGW, KYW, $Mg_2SiO_4$, YLF, $YVO_4$, $GdVO_4$, or the like is doped with Nd, Yb, Cr, Ti, Ho, Er, or the like.

28. The method for manufacturing a semiconductor device according to claim 25, wherein the semiconductor substrate is an N-type or P-type single-crystal semiconductor substrate, a GaAs substrate, an InP substrate, a GaN substrate, a SiC substrate, a sapphire substrate, a ZnSe substrate, or a substrate manufactured by a pasting method or a SIMOX (Separation by IMPlanted OXygen) method.

29. The method for manufacturing a semiconductor device according to claim 25, wherein the semiconductor substrate is a substrate made of an insulating material such as glass, quartz, or synthetic resin where a single-crystal semiconductor film is formed.

30. The method for manufacturing a semiconductor device according to claim 25, wherein the extension region is formed shallower than the source region and the drain region.

31. The method for manufacturing a semiconductor device according to claim 30, wherein the extension region is formed 0.1 to 20 nm in depth.

32. The method for manufacturing a semiconductor device according to claim 25, wherein arsenic or phosphorus is used as the first impurity element and the second impurity element.

33. The method for manufacturing a semiconductor device according to claim 25, wherein boron is used as the first impurity element and the second impurity element.

34. The method for manufacturing a semiconductor device according to claim 25, wherein the semiconductor device is applied to a CPU, a memory, or an IC.

35. The method for manufacturing a semiconductor device according to claim, wherein at least one of the CPU, the memory and the IC are applied to an electronic appliance selected from the group consisting of a digital video camera, a digital camera, a reflective projector, a display, a head mount display, a navigation system, a sound reproducing device, a mobile terminal, a game machine, and an image reproducing device equipped with a recording medium.

36. The method for manufacturing a semiconductor device according to claim 25, wherein the laser beam has a wavelength of 370 to 640 nm.

\* \* \* \* \*